United States Patent [19]
Kasai et al.

[11] Patent Number: 6,107,924
[45] Date of Patent: *Aug. 22, 2000

[54] HIGH FREQUENCY TYPE SENSING DEVICE

[75] Inventors: Eiji Kasai, Kameoka; Akinori Katoh, Mukou; Misako Inagami, Takatsuki, all of Japan

[73] Assignee: Omron Corporation, Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/565,028

[22] Filed: Nov. 30, 1995

[30] Foreign Application Priority Data

| Nov. 30, 1994 | [JP] | Japan | 6-296280 |
|---|---|---|---|
| May 25, 1995 | [JP] | Japan | 7-126585 |
| May 16, 1995 | [JP] | Japan | 7-116795 |
| Jun. 19, 1995 | [JP] | Japan | 7-151895 |

[51] Int. Cl.$^7$ .................................................. G08B 21/00
[52] U.S. Cl. .............................................. 340/627; 324/204
[58] Field of Search ....................... 340/627, 552, 340/568.1; 324/204; 73/53.01, 61.41, 61.71

[56] References Cited

U.S. PATENT DOCUMENTS

| 3,758,851 | 9/1973 | Yokoyama et al. | 324/682 |
|---|---|---|---|
| 4,262,246 | 4/1981 | Fujii | 324/58 |
| 4,352,288 | 10/1982 | Paap et al. | 73/61.41 |
| 4,366,473 | 12/1982 | Inoue et al. | 340/562 |
| 4,590,424 | 5/1986 | Girot et al. | 324/204 |
| 4,646,066 | 2/1987 | Baughmann et al. | 340/540 |
| 4,678,992 | 7/1987 | Hametta | 324/208 |
| 4,859,940 | 8/1989 | Hummert et al. | 324/204 |
| 5,012,206 | 4/1991 | Tigges | 331/65 |
| 5,583,432 | 12/1996 | Barnes | 324/204 |
| 5,585,729 | 12/1996 | Toshima et al. | 324/204 X |

FOREIGN PATENT DOCUMENTS

| 2 620 238 | 10/1989 | France . |
|---|---|---|
| 6-164358 | 6/1994 | Japan . |

OTHER PUBLICATIONS

Patent Abstracts of Japan, vol. 9, No. 75, Apr. 4, 1985 (JP–A–59–208902).
Patent Abstracts of Japan, vol. 16, No. 396, Aug. 21, 1992 (JP 4-130236).
Journal of Vacuum Science & Technology B, vol. 12, No. 1, Jan. 1994–Feb. 1994, Woodbury, NJ, pp. 395–398, Bhimnathwala, et al., "Measurement of the sheet resistance of doped layers in semiconductors by microwave reflection".

*Primary Examiner*—Thomas Mullen
*Attorney, Agent, or Firm*—Foley & Lardner

[57] ABSTRACT

A sensing device in which a high frequency signal is transmitted from an oscillator to a sensor through a transmission path, a reflection signal generated according to a variation of an impedance of the sensor sensing the presence or absence of an article is detected by a reflected wave sensor, and the presence or absence of the article is detected by the presence or absence of the reflection signal and a level of the signal, whereby the presence or absence of an article other than metal and the kind of the article can be detected regardless of whether a container holding the article is transparent or opaque.

18 Claims, 36 Drawing Sheets

HIGH FREQUENCY TYPE SENSING DEVICE

BACKGROUND OF THE INVENTION

1. Field of the Invention

This invention relates to a sensing device employing a high frequency signal for sensing an object, and more particularly to an improved device capable of sensing the presence or absence of various articles such as material, liquid, powder and the human body and kinds thereof.

2. Discussion of the Related Art

Conventional sensing devices for sensing the presence or absence and the kind of material and liquid are represented by a device employing an electrical conductive method for detecting a voltage drop of an electricity applied to the material or a dielectric method by contacting the same, a proximity switch, a photoelectric switch and an ultrasonic switch. Conventional sensing devices for sensing the presence or absence of the human body are represented by a weight sensor for measuring the weight, an electrostatic capacity sensor utilizing an electrostatic capacity varying with the approach of the human body, a photo sensor for detecting the reflection or interruption by the human body, an infrared sensor, and an ultrasonic sensor.

As a sensing method for detecting a concentration of salt in liquid there have been proposed heretofore an electric conductive method for putting an electrode into liquid and applying electricity thereto to measure a voltage drop therein, a dielectric method by contacting the liquid, and a method for radiating an ultrasonic wave and measuring a degree of its reflection from a reflector.

According to the conventional sensing devices and methods, it is impossible to precisely detect material or liquid contained in a small opaque container without any contact therewith. Particularly in the conventional electrical conductive method and dielectric method an article or substance to be measured thereby should be contacted and light is necessary to penetrate the container. Moreover it is impossible for the ultrasonic sensor to measure a small container. The electrical conductive, light and ultrasonic methods cannot perform the identification of the kind of an article.

A conventional proximity switch employing a high frequency is designed to detect metal having a high magnetic permeability. The switch employs a self-excited oscillation, in which a high frequency oscillation coil itself is a sensor and an impedance of the coil varies or the oscillation stops or starts as a metal approaches the coil. This switch, however, cannot detect an article or substance having a low magnetic permeability.

The above-mentioned conventional sensors cannot discriminate the human body at a standstill from a piece of baggage. The weight sensor erroneously identifies heavy baggage seated on the sensor as the human body. The photo sensor erroneously identifies the presence of an object whenever light is interrupted by any material. The ultrasonic sensor erroneously identifies the presence of an object whenever the ultrasonic wave is reflected by any material. The infrared sensor has the disadvantage that the motion of an object is judged to be the presence of human body and the human body at a standstill is ignored.

An electrostatic capacitive sensor installed in a chair is conventionally used, but sensible to external conditions. If a foot separates from a floor, the sensor is erroneously operated. A child not reaching the floor sits on the chair cannot be detected.

According to the conventional liquid concentration detecting method, an electrode or a reflector is necessary to be put into the liquid and the detection cannot be performed without contact with the liquid. Washing the electrode and the reflector is necessary prior to every measurement, and unfavorably takes time for many processes made in continuing measurement. This method also has the disadvantage that the electrode or the reflector corrodes due to salt. The method employing an ultrasonic wave cannot perform the measurement unless the container has a diameter larger than 5 cm.

SUMMARY OF THE INVENTION

It is, therefore, a primary object of this invention to provide an improved sensing device and method capable of accurately sensing an article substance such as liquid, powder and so forth in addition to metal whether transparent or opaque, and moreover of sensing the kind of the article.

It is a further object of this invention to provide a human body sensing device and method capable of precisely sensing the human body at a standstill by discriminating the human body from other substances, and a substance sensing device capable of sensing other articles than the human body.

It is a still further object of this invention to provide a liquid concentration sensing device and method of easily measuring a concentration of liquid without any contact therewith in a short measuring time, which is free from causing any corrosion of electrodes.

According to a first aspect of this invention there is provided a sensing device including an oscillator for generating a high frequency signal, a sensor including a resonance circuit receiving the high frequency signal from the oscillator, and a detector for producing a signal relating to a variation of an impedance change of the sensor, in which the sensor and the detector consist of passive elements without employing any active elements. The high frequency signal is applied from the oscillator to the sensor. When impedance matching of the sensor is made in the absence of any article or substance, the impedance of the sensor varies to lose the impedance matching when a substance exists and a signal such as a reflection signal relating to the variation of the impedance is produced. When any substance does not exist, the impedance matching is maintained and any output signal is not produced. By sensing the presence or absence and a magnitude of the signal in the sensor, the presence or absence and the kind of the substance can be identified. The sensing device is capable of sensing a non-magnetic substance, and the sensor and the detector consist of passive elements, so that power consumption can be partially reduced and the device can be miniaturized.

When the sensing device further employs a toroidal core wound by a coil, a magnetic flux density in air between ends of the core is so high that the detection sensitivity of a substance and a material can be high. When the sensing device further employs a transformer for supplying a resonance circuit with electric power, the imaginary part of an impedance of the sensor can be zero and the real part can be set to a predetermined value.

According to a second aspect of this invention there is provided a sensing device including an oscillator for generating a high frequency signal, a sensor including a resonance circuit receiving the high frequency signal from the oscillator, a detector for producing a signal relating to a variation of an impedance change of the sensor, in which the high frequency signal is designed to be such a high frequency that there exists a difference in outputs of the detector in the presence and the absence of a predetermined non-magnetic material or substance near the sensor. The potential frequency is between 10 MHz and 300 MHz. When a non-magnetic substance such as liquid, powder or solid exists near the sensor, the impedance of the sensor varies in comparison with the impedance in the absence of the substance and a signal different from the impedance in the absence of the substance is produced from the detector. Thus, the sensing device can sense the presence or absence and the kind of non-magnetic substance.

According to a third aspect of this invention there is provided a sensing device including an oscillator for generating a high frequency signal, a sensor including a resonance circuit having a coil disposed to be influenced by a magnetic permeability of material or substance nearby and receives the high frequency signal from the oscillator, and a detector detecting a variation of the resonance circuit influenced by the magnetic permeability of the external near material or substance to produce a signal relating to the variation. This sensing device also can identify fluid, powder and solid.

According to a fourth aspect of this invention there is provided a sensing device including an oscillator for generating a high frequency signal, a sensor including a resonance circuit having such a resonance frequency that a signal frequency of the oscillator is positioned on a steep slope of a resonance characteristic, and a detector for producing a signal relating to an external state near the sensor. The oscillation frequency is designed to be positioned on the steep slope of the resonance characteristic of the sensor. Accordingly, when a substance approaches the sensor and the frequency characteristic of the sensor slightly varies, the signal output varies largely, so that the detection accuracy is improved.

According to a fifth aspect of this invention there is provided a sensing device including an oscillator for generating a high frequency signal, a sensor including a resonance circuit receiving the high frequency signal from the oscillator in which the resonance circuit resonates and an imaginary number of its impedance is set to be around zero when the external near state is a reference state, and a detector for producing a signal relating to an increase of the imaginary number of the impedance of the sensor. As an article or substance approaches near the resonance circuit of the sensor, an imaginary part of the impedance of the sensor increases and the output signal of the detector also increases. Since a variation of the impedance including not only a real part but also an imaginary part is detected, a variation of an external state can be detected.

According to a sixth aspect of this invention there is provided a sensing device including an oscillator for generating a high frequency signal, a sensor including a resonance circuit receiving the high frequency signal from the oscillator, and a detector for detecting a reflected wave reflected in accordance with an external state near the sensor and producing a signal relating to the reflected wave. The output is generated according to the reflected wave from the sensor, and its processing is simplified.

According to a seventh aspect of this invention there is provided a sensing device including an oscillator for generating a high frequency signal, a sensor including a resonance circuit receiving the high frequency signal from the oscillator, and a detector connected with the oscillator and the sensor for separating an incident wave from the oscillator and a reflected wave from the sensor to respectively produce signals respectively corresponding to the waves. Since the incident wave and the reflected wave are separately generated, the flexibility of the application of the output is improved and the detection accuracy of substance and material can be improved.

According to an eighth aspect of this invention there is provided a sensing device including an oscillator for generating a high frequency signal, a sensor including a resonance circuit receiving the high frequency signal from the oscillator, a detector connected with the oscillator and the sensor for separating an incident wave from the oscillator and a reflected wave from the sensor to respectively produce signals respectively corresponding thereto, and a processor connected with a pair of outputs of the detector for producing an output signal relating to a ratio of the incident wave from the oscillator and the reflected wave from the sensor. In this sensing devices the incident wave applied to the sensor and the reflected wave from the sensor are separately generated to provide a ratio therebetween, so that their outputs are stable even if the high frequency signal of the oscillator varies and the detection is performed with high accuracy.

According to a ninth aspect of this invention there is provided a sensing device including an oscillator for generating a high frequency signal, a sensor including a resonance circuit receiving the high frequency signal from the oscillator, a detector for producing a signal relating to an external state near the sensor, and an attenuator employing a resistor interposed between the sensor and the oscillator. The attenuator regulates the application of the high frequency signal from the oscillator to the sensor or the reflection signal from the sensor to the oscillator, whereby the output of the oscillator is stabilized. Even if metal approaches the sensor and the output of the reflected wave increases, the reflected power is consumed by the attenuator, whereby stop of the output from the oscillator can be avoided.

According to a tenth aspect of this invention there is provided a sensing device including an oscillator for generating a high frequency signal, a sensor including a resonance circuit receiving the high frequency signal from the oscillator, a detector for producing a signal relating to an external state near the sensor, and a negative feedback circuit interposed between the sensor and the oscillator. The high frequency signal from the oscillator is controlled by the negative feedback circuit to be at a constant level for application to the sensor, whereby the application of the high frequency signal is stabilized.

According to an eleventh aspect of this invention there is provided a sensing method including the steps of applying a high frequency signal from an oscillator to a sensor having a resonance circuit, detecting a signal including a reflected wave reflected by the sensor relating to an external state, and detecting the external state or the presence or absence of a substance or material.

According to a twelfth aspect of this invention there is provided a sensing method including the steps of applying a high frequency signal from an oscillator to a sensor having a resonance circuit, detecting a voltage or a current of the sensor which varies according to an external state, and detecting an article or substance based on the voltage or the current.

According to a thirteenth aspect of this invention there is provided a sensing device including an oscillator generating a high frequency signal, a sensor having a resonance circuit receiving the high frequency signal from the oscillator, a detector producing a signal relating to an external state near the sensor, and a judging means for discriminating the output signal of the sensor to judge the presence or absence of a predetermined liquid. This sensing device does not require any float to detect a liquid level, nor erroneously detect bubbles. The device also can detect liquid contained in a closed container. The presence or absence of liquid or substance and the concentration of salt solute is detected without any contact, so that the sensor can be prevented from corrosion.

According to a fourteenth aspect of this invention there is provided a boundary sensing device including an oscillator generating a high frequency signal, a sensor including a resonance circuit receiving the high frequency signal from the oscillator, a detector for detecting a reflected wave reflected according to an external state near the sensor to produce a signal according to the reflected wave, and a boundary detector for detecting a changing point of a reflection signal from the sensor based on the output signal from the detector to detect a boundary of a substance. This device can detect a boundary between liquid and liquid, liquid and gas, and gas and powder.

According to a fifteenth aspect of this invention there is provided a powder sensing device including an oscillator for generating a high frequency signal, a sensor including a resonance circuit receiving the high frequency signal from the oscillator, a detector for detecting a reflected wave reflected according to an external state near the sensor to produce a signal according to the reflected wave, and a powder detector for discriminating the output signal from the sensor at a level to judge the presence or absence of a powder. This device can detect a wheat flour, a skim milk, a coffee powder, a cocoa powder, a refined sugar or the like.

According to a sixteenth aspect of this invention there is provided a humidity sensing device including an oscillator for generating a high frequency signal, a sensor including a resonance circuit receiving the high frequency signal from the oscillator, a detector for detecting a hygroscopicity powder disposed near the sensor and a reflected wave of the sensor to generate a signal relating to the reflected wave, and a processor for converting the output signal of the detector into a humidity.

According to a seventeenth aspect of this invention there is provided a liquid concentration sensing device including an oscillator for generating a high frequency signal, a sensor including a resonance circuit for receiving the high frequency signal from the oscillator, a detector for detecting a reflected wave reflected according to an external state near the sensor to produce a signal relating to the reflected wave, a processor for converting the output signal from the detector into a solute concentration, and a display for displaying the output signal from the processor. In this device the sensor is disposed near a container containing a liquid, and the high frequency signal is sent to the sensor from the oscillator through a transmission section. A reflection signal correlating to a liquid concentration returns to the transmission from the sensor to be detected by the detector. The detected signal is converted into a solute concentration to be displayed by the display.

The liquid concentration sensing device employing a temperature sensor to sense a temperature of liquid can correct a measurement error caused by temperatures, and reduce the measurement time.

According to a eighteenth aspect of this invention there is provided a liquid concentration sensing method including the steps of applying a high frequency signal from an oscillator to a sensor having a resonance circuit, taking a signal relating to a concentration of a liquid to be detected in a detector connected with the sensor, converting the taken signal into a solute concentration in a processor, and displaying the converted value on a display.

According to a nineteenth aspect of this invention there is provided a temperature sensing device including an oscillator for generating a high frequency signal, a sensor including a resonance circuit for receiving the high frequency signal from the oscillator, a detector for detecting a reflected wave reflected from a temperature dependent water solution disposed near the sensor and the sensor to produce a signal relating to the reflected wave, a processor for converting the output signal relating to the temperature of the water solution into a temperature, and a display for displaying an output signal produced from the processor.

According to a twentieth aspect of this invention there is provided a substance sensing device including an oscillator for generating a high frequency signal having a different frequency, a sensor including a resonance circuit receiving the high frequency signal from the oscillator, a detector for producing a signal relating to an external state near the sensor, and a controller for detecting an article or substance based on an output signal produced from the detector and the oscillation frequency generated from the oscillator. In this substance sensing device the high frequency signal is applied to the sensor from the oscillator. The oscillation frequency of the oscillator automatically varies over a predetermined range and is scanned. The high frequency signal applied to the sensor produces a reflected wave according to external circumstance of the sensor. The reflected wave is detected by the detector to be generated. The reflected wave has different magnetic permeability according to different external state such as air, substance, the human body and so forth, and the impedance varies with the difference of the permeability, so that the reflected wave is generated at a different level according to the frequency. When nothing exists near the sensor or when baggage exists, the reflected wave becomes to small at a frequency as exemplarily shown in FIG. 29. In other words, a quality factor Q becomes high. When the human body exists, the factor Q is small with a resonance characteristic and a reflected wave is always higher than a reference value. Accordingly, the detection of baggage or the human body is performed based on the magnitude of the reflected wave in a scanning range of the frequency. Thus the standstill human body and baggage can be discriminated on detection because an object is detected by changing the frequency of the oscillator. The detection of the human body or a child can be performed without any contact and influence by clothes nor weight. The electromagnetic field immunity is strong, and the detection resolution is high.

According to a twenty-first aspect of this invention there is provided a human body or substance sensing device including an oscillator for generating a high frequency signal having a different frequency, a sensor including a resonance circuit having a coil corresponding to dimensions of a detected portion of the human body, a detector for producing a signal relating to an external state near the sensor, and a controller for identifying the human body and other substances for detection based on an output signal produced from the detector and the oscillation frequency generated from the oscillator.

According to a twenty-second aspect of this invention there is provided a substance sensing method including the steps of generating a high frequency signal at an oscillator, applying the high frequency signal to a sensor having a resonance circuit varying a frequency of the high frequency signal, measuring the respective reflected power about the respective frequencies of the oscillation, and detecting a substance such as baggage or the human body based on the relation of the respective frequencies and the reflected power.

According to a twenty-third aspect of this invention there is provided a sensing device including an oscillator for generating a high frequency signal having a different frequency, a sensor including a resonance circuit receiving the high frequency signal from the oscillator and having a coil so disposed to be influenced by the permeability of a material or substance near the sensor, a detector for detecting a variation in the resonance circuit influenced by a permeability of material or substance externally existing near the sensor to produce a signal relating to the variation, in which the sensor is connected with the oscillator and the detector through a cable and separately isolated from the oscillator and the detector. Since the sensor is isolated, miniaturization of the sensor is possible and the sensor can be installed to a small space or any place.

BRIEF DESCRIPTION OF THE DRAWINGS

Other objectives and advantages of this invention will be more readily apparent from the following detailed description provided in conjunction with the following figures, of which.

DETAILED DESCRIPTION OF THE INVENTION

Figure 1:
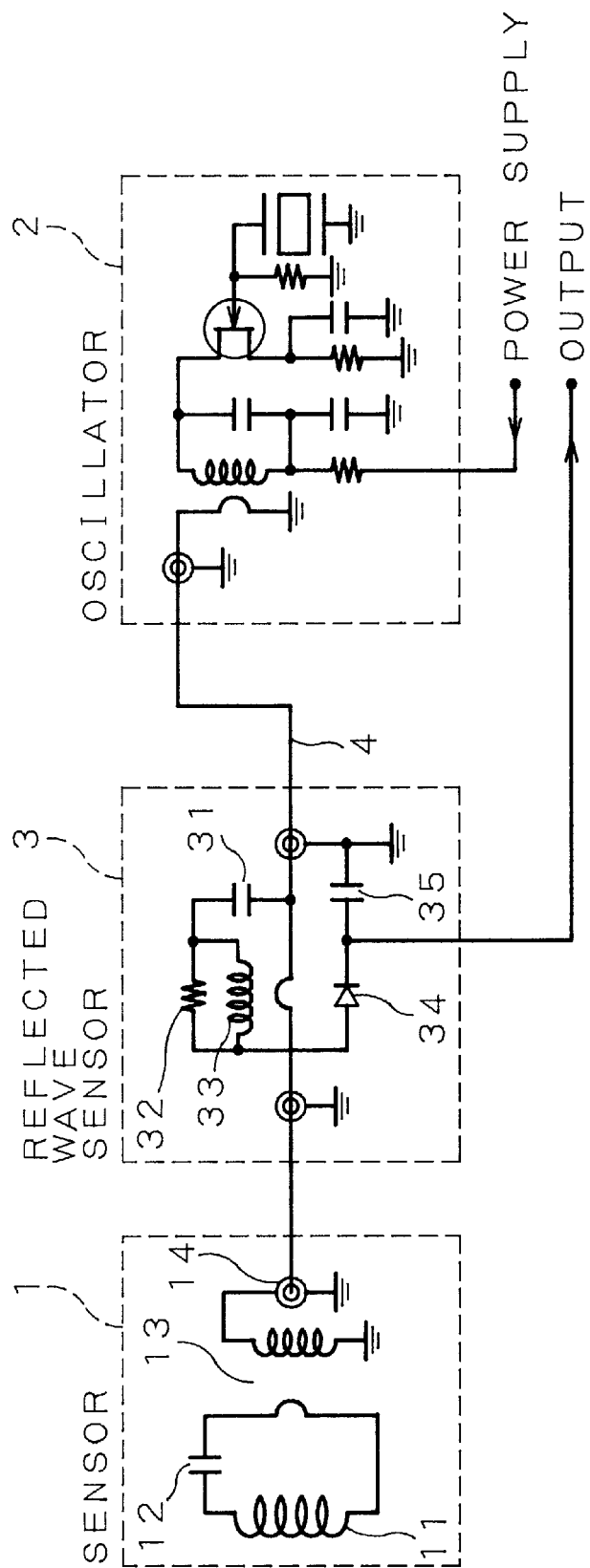
FIG. 1 is a schematic circuit diagram of a substance sensing device as a first embodiment of this invention.

Referring, now, to FIG. 1, there is shown a circuit diagram of a substance sensing device as a first embodiment of this invention, which includes a sensor 1, an oscillator 2 for transmitting a high frequency signal through a transmission path 4 to the sensor 1, and a reflected wave sensor 3 as a detector detecting a reflection signal of the high frequency signal applied to the sensor 1 which is reflected by the sensor 1 and returning toward the oscillator 2. The reflected wave sensor 3 as one example of a detector and the sensor 1 consist of passive elements, not employing any active elements.

Figure 2:
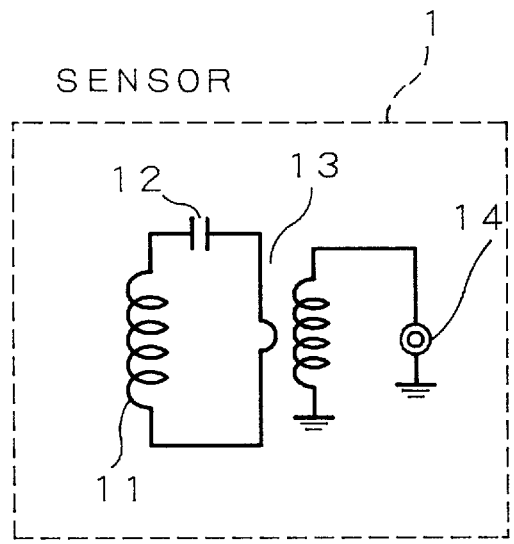
FIG. 2 is a circuit of a sensor employed in the sensing device of FIG. 1.

The sensor 1 includes a detection coil 11, a resonance capacitor 12 forming a series resonance circuit with the detection coil 11, and a real number transformer 13 in which a primary coil thereof is connected with the resonance circuit in an input side and a secondary coil thereof is connected with a high frequency input terminal 14 and a ground as also shown in FIG. 2. The resonance circuit may employ a parallel resonance circuit if desired.

The oscillator 2 is an oscillation circuit employing a crystal oscillator. If desired, the oscillation circuit may be other conventional high frequency oscillation circuit such as a LC oscillator or a phase locked loop (PLL). The oscillator 2 generates an output frequency of 40.68 MHz, but the output frequency may be designed to be between 10 MHz and 300 MHz suitable for detecting a non-magnetic material and maintaining a small size for the device. The reflected wave sensor or detector 3 includes a directional coupler, and detects the reflected wave from the sensor 1 as a power for conversion into a voltage. The sensor 3 includes a capacitor 31 connected with the transmission path 4 and a parallel circuit consisting of a resistor 32 and a coil 33 M-coupled with the transmission path 4. The parallel circuit at one end thereof is connected with the capacitor 31 and at another end thereof is connected with an anode of a diode 34. A cathode of the diode 34 is grounded through a capacitor 35 and externally generates an analog output signal representing a reflected wave converted into a voltage. The reflected wave sensor 3 employs CM coupling, but may employ MM coupling or other sensor if desired.

In this substance sensing device the high frequency signal is applied from the oscillator 2 to the sensor 1 through the transmission path 4. Assuming that a resonance frequency of the resonance circuit is set to coincide with the frequency of the oscillator 2 and that an impedance (an imaginary part is zero and a real part is 50 ohm) of the sensor 1 and an impedance of the transmission path 4 are matched when a circumstance in the absence of a detected substance (or material) is air, the reflection of a transmitted high frequency signal is almost zero and the output from the reflected wave sensor 3 is zero, whereby the absence of the substance to be detected is detected.

When the substance or object exists, the sensor 1 is magnetically influenced by the difference of magnetic permeability of the air and the substance, and the impedance varies. As the impedance of the sensor 1 is largely shifted from the matched impedance, the reflection signal becomes large and is detected by the detector 3 to generate an analog signal corresponding to the variation of the impedance viz. the reflected wave so that the presence of the substance is detected. Thus, the presence or absence of a substance can be detected. For detection of the presence or absence of a substance or material the reflected wave is detected by the detector 3, but the difference of permeability of a substance or material has only to be detected. It may be designed that the numerical value of an imaginary part of the impedance of the resonance circuit is set around zero on resonance in the sensor 1 and an analog signal corresponding to the increase of the imaginary numerical value of the impedance is generated from the detector 3 on detection of the substance or material.

Figure 5:
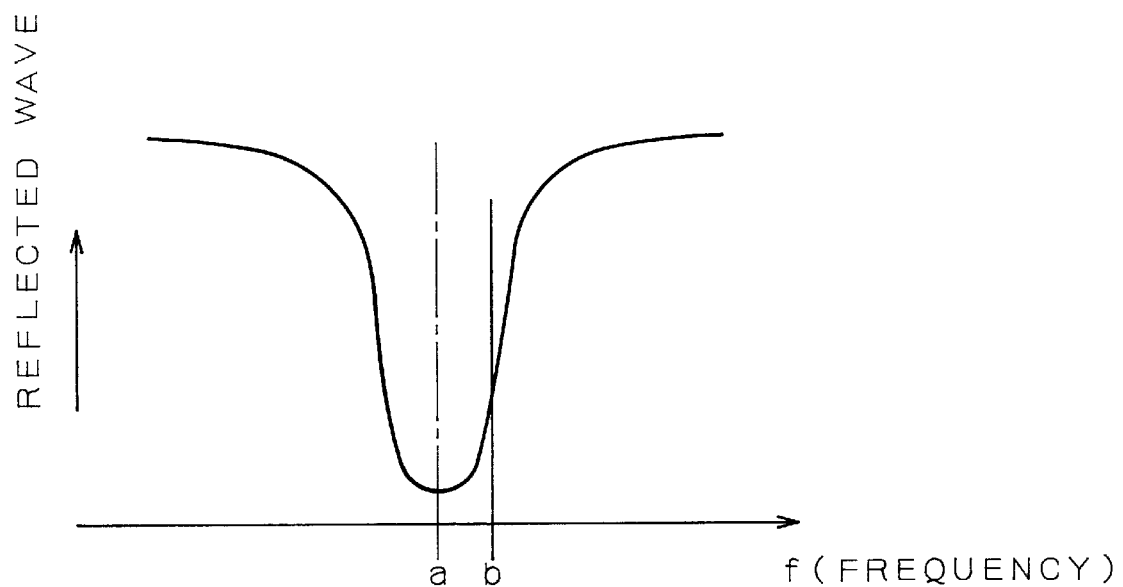
FIG. 5 is a graph showing a reflection characteristic of the sensor of FIG. 1.

When the reflected wave of the sensing device of this embodiment is employed for judgement of a material or liquid having a low magnetic permeability, the variation of the reflected wave itself is extremely small and the change of the output voltage corresponding to the reflected wave also becomes small if measured from the minimum point of the reflected wave as shown at a point "a" of FIG. 5 showing a reflection characteristic of the sensor of FIG. 1. Accordingly, if the measurement is initiated from a reflection point (for instance a point "b" of FIG. 5) providing the largest slope within 80% in the curve of FIG. 5, the variation of the output voltage about the reflected wave becomes large and the sensitivity of the sensor becomes high. In this case, the oscillation frequency of the oscillator 2 is designed to be shifted from the resonance frequency of the sensor 1 to a frequency at a steep slope point of the resonance characteristic.

Figure 3:
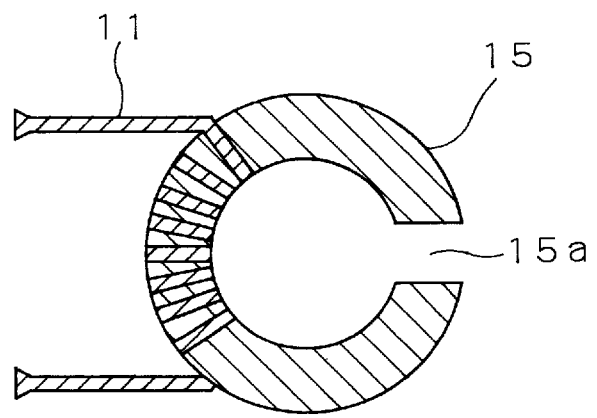
FIG. 3 shows a detection coil wound around a troidal core.

The detection coil 11 of the sensor 1 does not employ an air-core coil, but a coil wound around a C-shaped core as shown in FIG. 3 which is formed by cutting a portion 15a from a toroidal core 15 so that magnetic fluxes can be concentrated and the reduction of a leaking magnetic field and increase of the sensitivity can be obtained. By changing the form or size of the cut portion 15a various material and liquid can be precisely detected.

Figure 4:
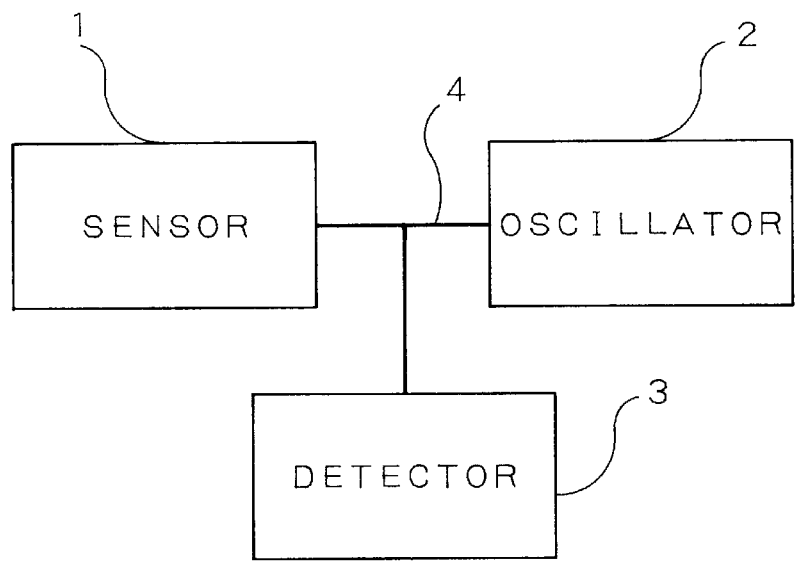
FIG. 4 is a schematic block diagram of a sensing device as a modification of the sensing device of FIG. 1.

As a modification of the sensing device of the first embodiment in which a reflected power is detected and the presence or absence of or the kind of a substance is detected based on the magnitude of the reflected power, FIG. 4 shows a circuit block diagram of a sensing device. Detector 3 detects at least one of a phase, a voltage and a current of a reflected wave on transmission path 4 between sensor 1 and oscillator 2 to generate a signal which can be processed and converted into a reflected power. By mounting the oscillator 2 and the detector 3 on a same board, connecting the sensor 1 with the detector 3 by a cable, and arranging sensor 1 separated and independent from the oscillator 2 and detector 3, the degree of freedom about a mounting position of the sensor 1 is increased and the sensor 1 can be easily replaced.

Applications of the sensing device of FIG. 1 will be described hereinafter. FIGS. 6 to 14 at left and right hand sides show schematic views of the sensing device of FIG. 1 and the relationship between an output signal V of the reflected wave sensor 3 and a position P of the sensor 1, in which corresponding positions are shown in two-dotted lines. For detection of the presence or absence of liquid, a voltage value at a point of a curve at a right hand side crossing the two-dotted line is designed to be a threshold value for level discrimination. This threshold value is set to a level discriminating means of a processor (not shown in FIG. 1) receiving the output from the reflected wave sensor 3 of FIG. 1. For detection of a boundary, the output of the reflected wave sensor 3 is read by CPU or the like by sampling, and a time point when the output makes a large variation is detected.

Figure 6:
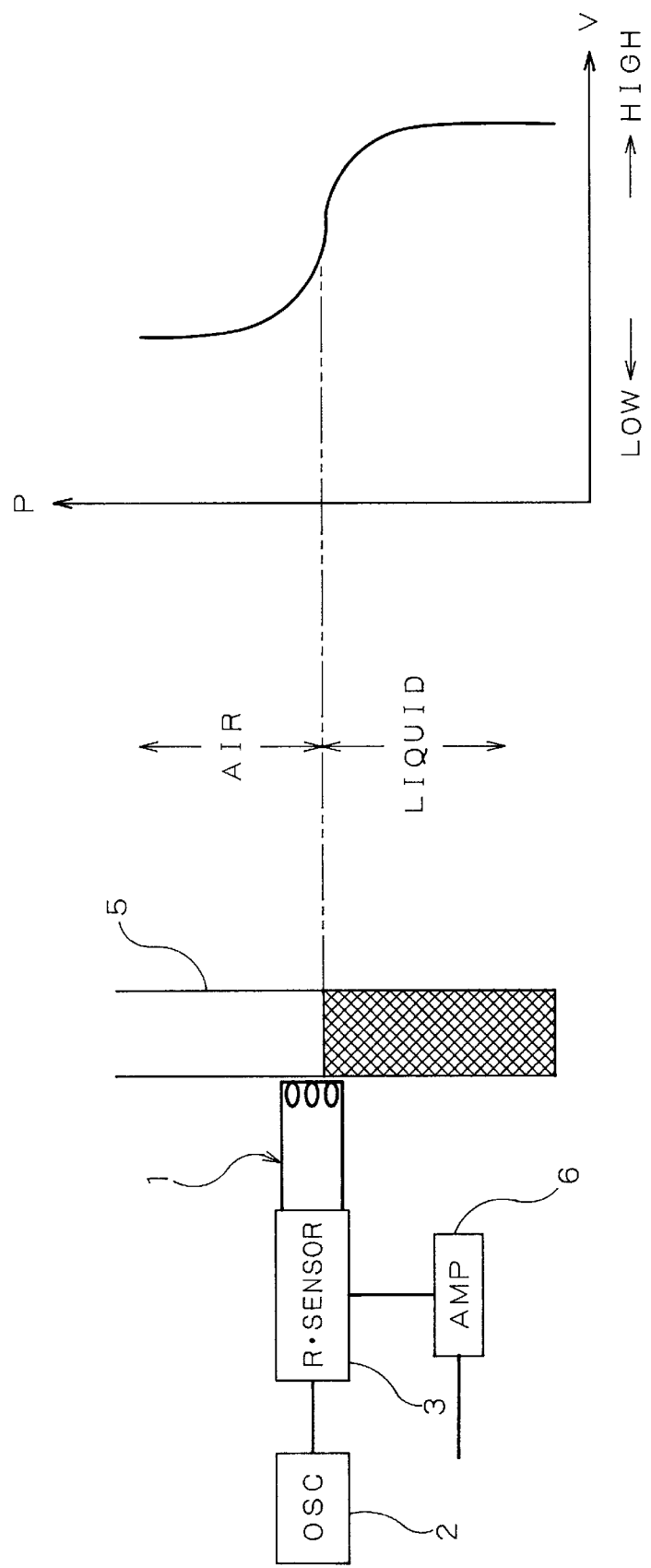
FIG. 6 shows the sensing device of FIG. 1 sensing a liquid level within a container without a lid.
Figure 12:
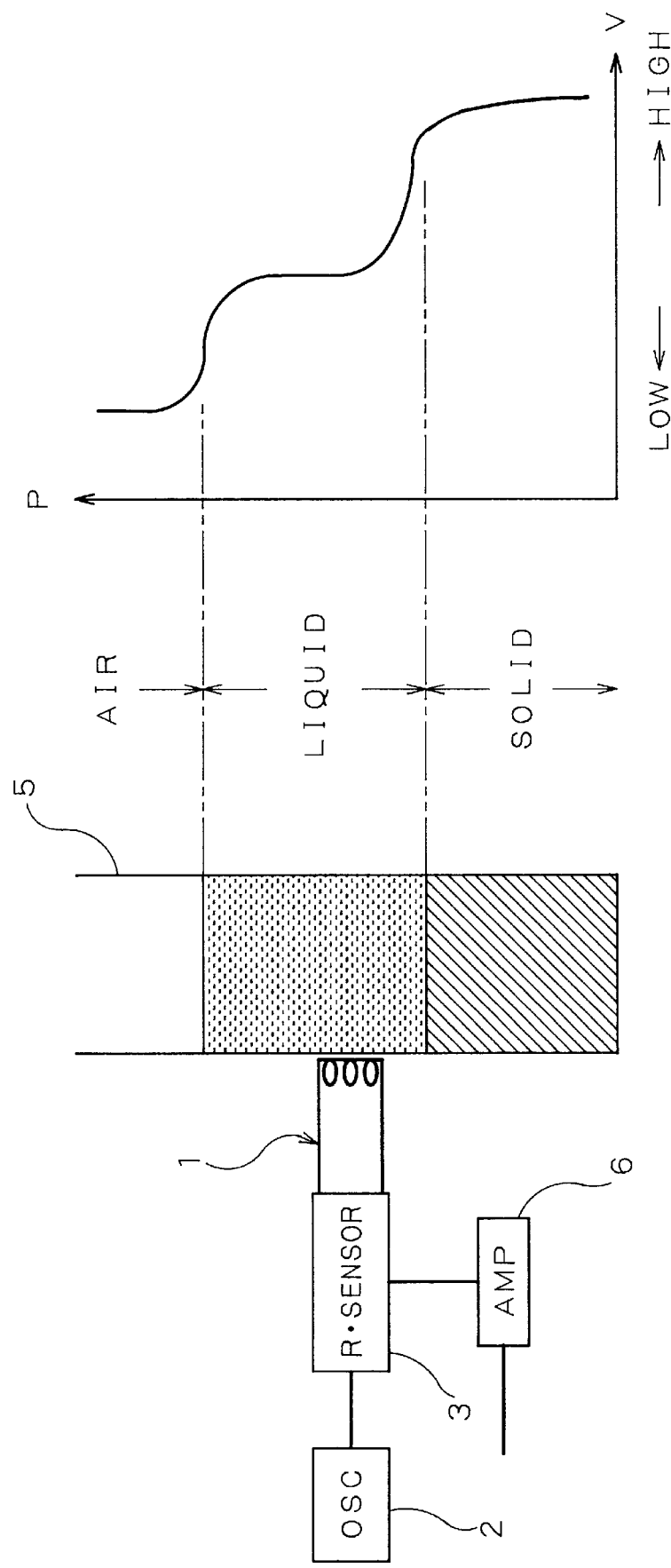
FIG. 12 shows the sensing device sensing a horizontal liquid boundary between a liquid and a solid.
Figure 13:
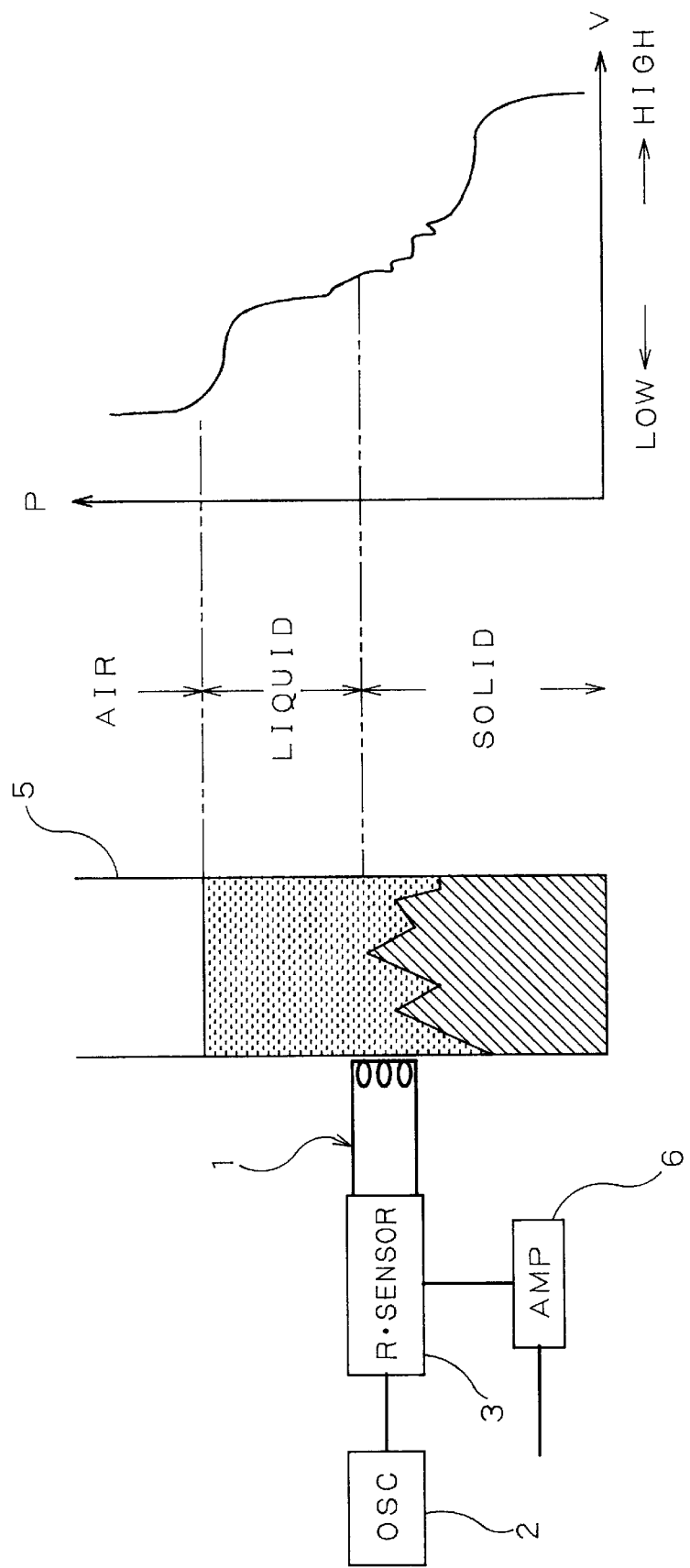
FIG. 13 shows the sensing device sensing a deformed liquid boundary between a liquid and a solid.
Figure 14:
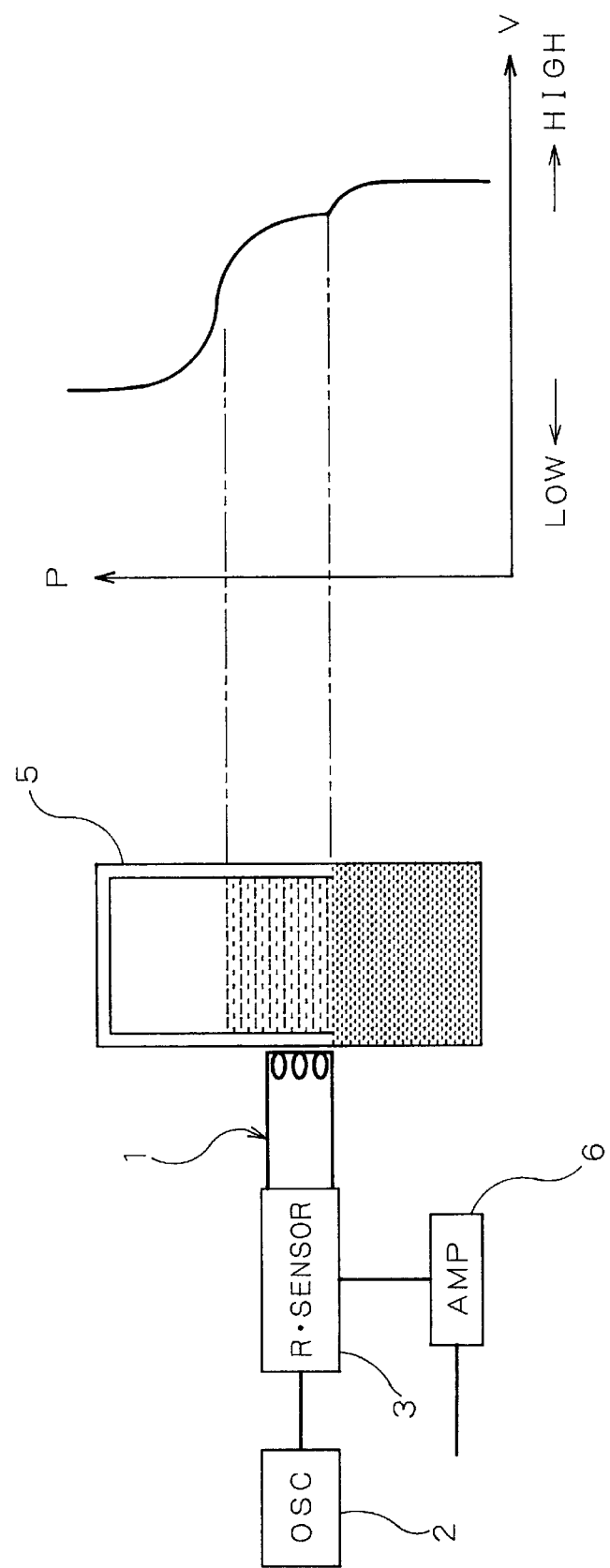
FIG. 14 shows the sensing device sensing a liquid level having bubbles.

Liquid, oil and solid in FIGS. 6 to 13 are water, olive oil and eraser, and liquid and bubbles of FIG. 14 are liquid, detergent and its bubbles. FIG. 6 shows detection of a liquid level within a container 5 having no lid. As the sensor 1 is lowered along an external side of the container 5 from the top, the output voltage V from the reflected wave sensor 3 through an amplifier 6 has a characteristic as shown by a curve at a right hand side of FIG. 6. The point where the output voltage largely changes corresponds to a boundary surface between air and liquid, viz. a liquid level.

Figure 7:
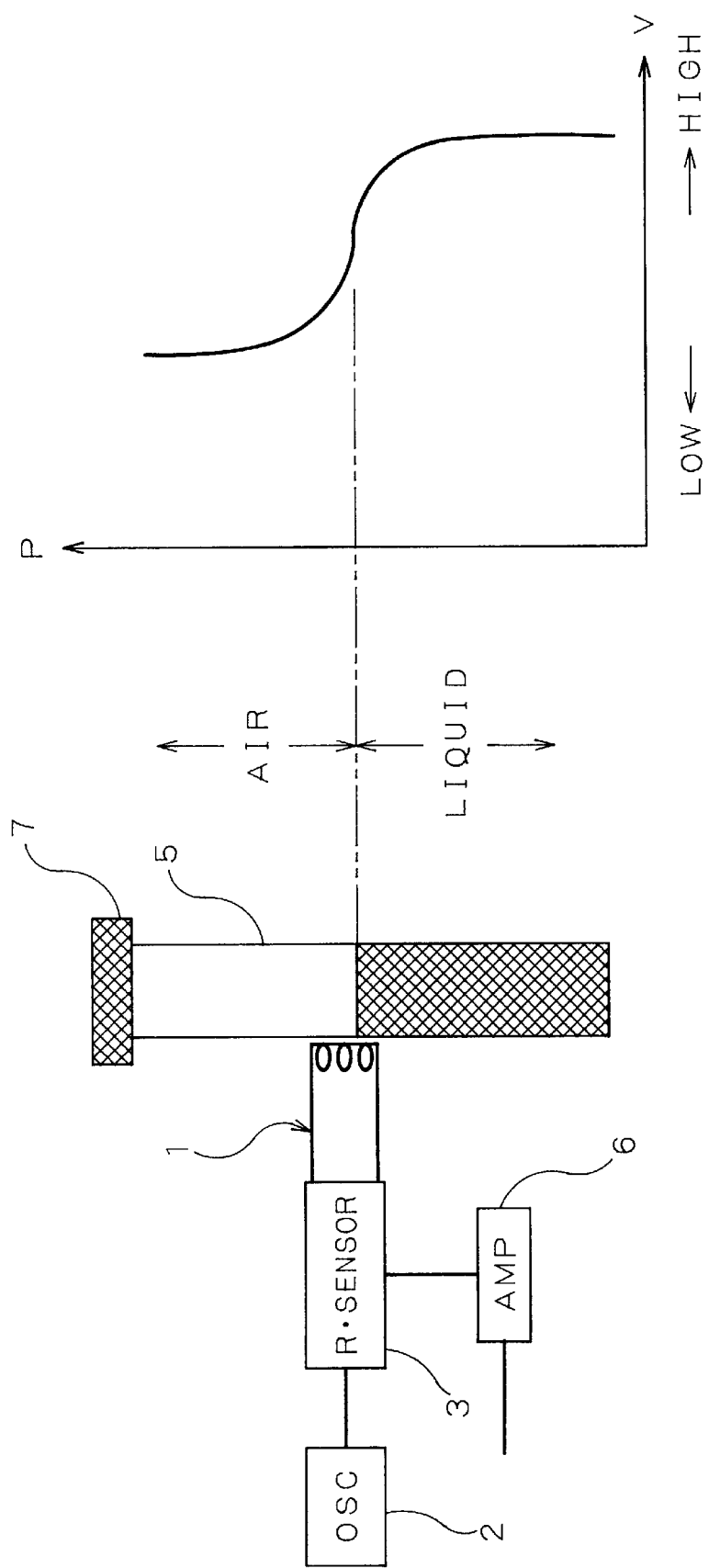
FIG. 7 shows the sensing device of FIG. 1 sensing a liquid level within a container with a lid.

FIG. 7 shows detection of a liquid level within a container 5 closed by a lid 7. If the container is not transparent, inside of the container cannot be seen from outside, so that the liquid level cannot be seen by human eyes. As shown in FIG. 7, however, the liquid level in the opaque container can be detected by the same operation as that of FIG. 6.

Figure 8:
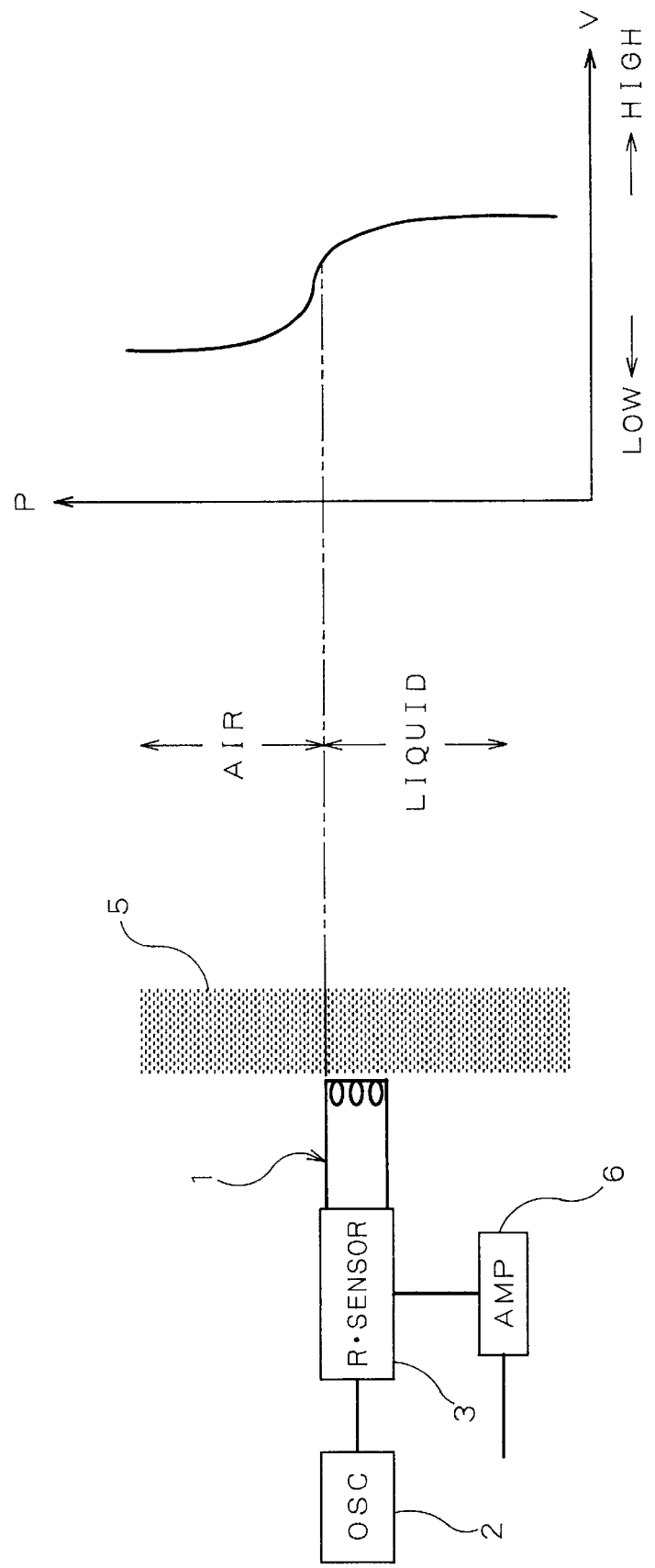
FIG. 8 shows the sensing device of FIG. 1 sensing a liquid level within an opaque container.

FIG. 8 shows detection of a liquid level within an opaque container 5. As the sensor 1 is lowered from top to bottom along an external side wall of the container, a position of the sensor 1 where the output voltage V from the amplifier 6 suddenly varies is found as a liquid level.

Figure 9:
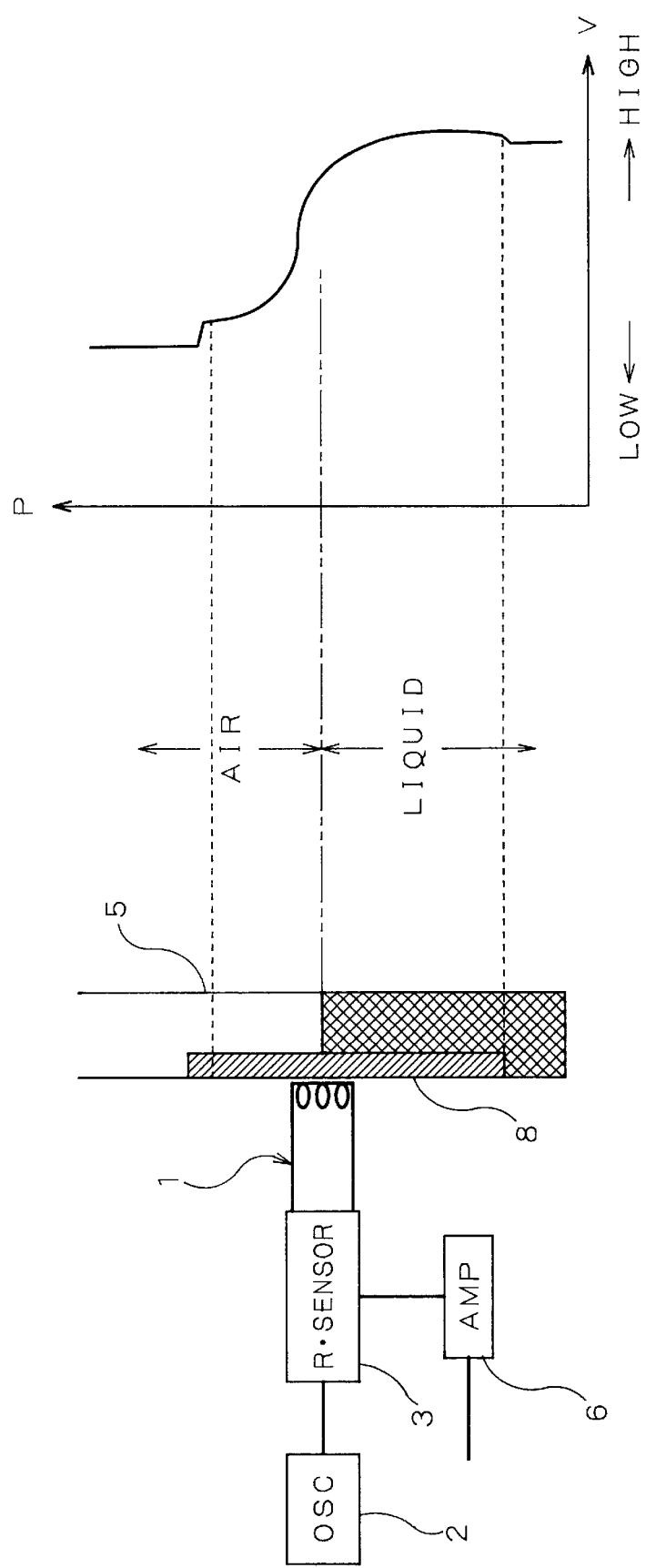
FIG. 9 shows the sensing device of FIG. 1 sensing a liquid level within a container with a label.

FIG. 9 shows detection of a liquid level within a container 5 with a label 8. The label 8 is adhered to a side wall of the container 5, and the liquid level cannot be seen by blockage of the label 8. As the sensor 1 is lowered from top to bottom along the label 8 as shown in FIG. 9, however, the output voltage V from the amplifier 6 is shown by a curve of FIG. 9 at a right hand side and a position of the sensor 1 where the output suddenly varies at a center is found as a liquid level.

Figure 10:
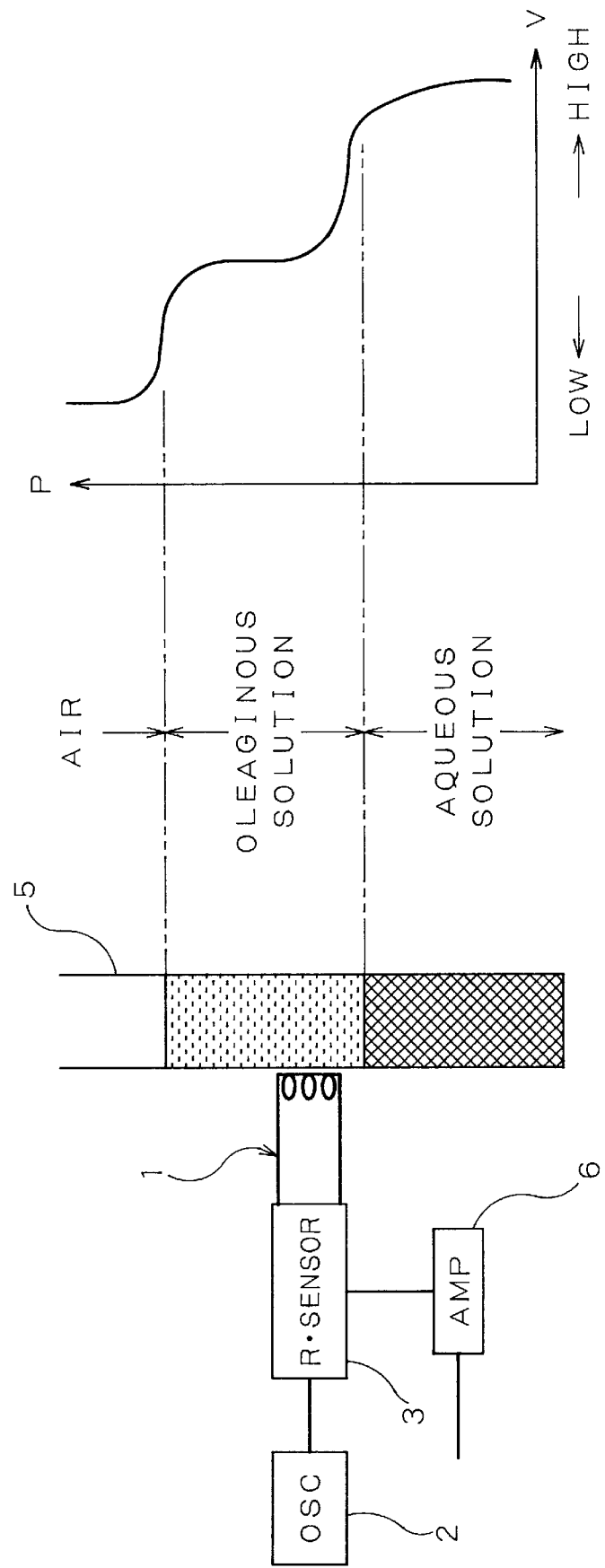
FIG. 10 shows the sensing device sensing horizontal liquid boundaries of an oleaginous solution and an aqueous solution.
Figure 11:
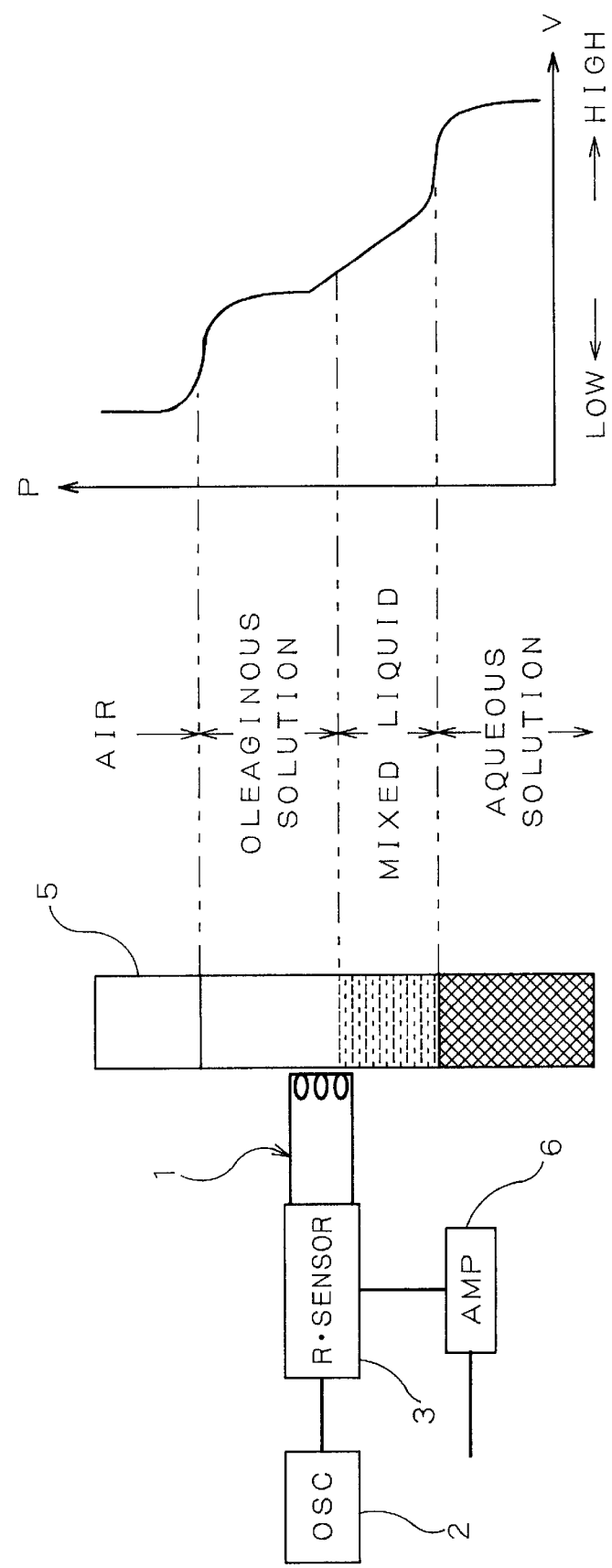
FIG. 11 shows the sensing device sensing liquid boundaries among an oleaginous solution, a mixed layer of an oleaginous solution and an aqueous solution, and an aqueous solution.

FIG. 10 shows detection of liquid boundaries of an oleaginous solution and an aqueous solution where the liquid boundaries are flat and horizontal. As the sensor 1 is lowered from the top of the container 5 to the bottom, the output voltage V from the amplifier 6 is shown by a curve of FIG. 10 in which an upper steep slope of the output voltage corresponds to a boundary between air and the oleaginous solution and a lower steep slope of the output voltage corresponds to a boundary between the oleaginous solution and the aqueous solution. As there is a mixed layer between an oleaginous solution and an aqueous solution as shown in FIG. 11, three inflection points appear on the curve of the output voltage shown at a right hand side of FIG. 11 and respectively correspond to the three boundaries of air-and-oleaginous solution, oleaginous solution-and-mixed layer, and mixed layer-and-aqueous solution. Thus, the output voltage characteristic allows detection of the boundaries.

FIGS. 12 and 13 show detection of liquid boundaries between liquid and solid. The boundary of FIG. 12 is horizontal and the boundary of FIG. 13 is deformed. In either cases, the liquid boundaries are detected by inflection points of an output voltage produced from the reflected wave sensor 3 through the amplifier 6.

FIG. 14 shows detection of a liquid level having bubbles. As the sensor 1 is lowered from top to bottom, an output voltage V provides a pair of inflection points in its output curve which correspond to the boundaries of air-and-bubbles and bubbles-and-liquid.

Figure 15A:
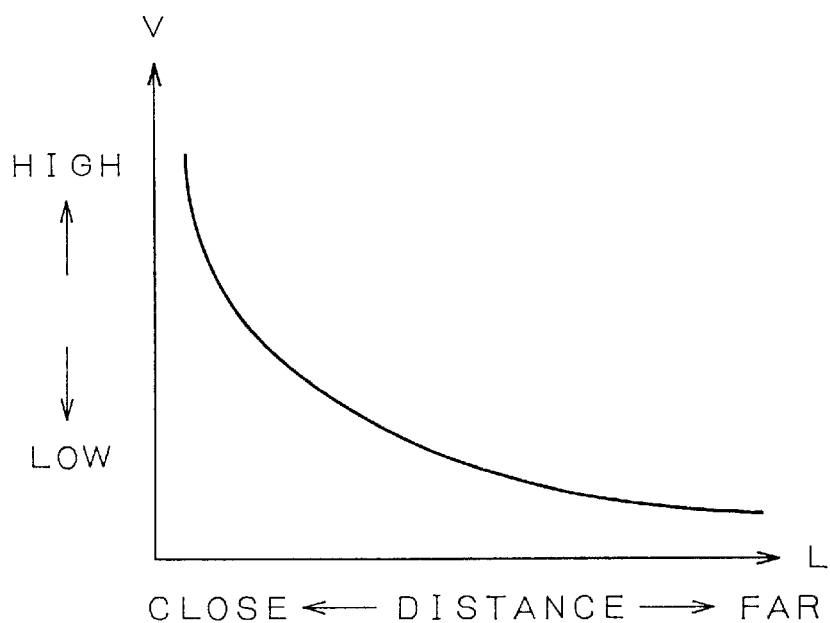
FIG. 15(a) is a graph showing the relation between an output of the sensing device and a distance from a measured sample to the sensor of the sensing device and FIG. 15(b) shows the sensing device sensing the measured sample.
Figure 15B:
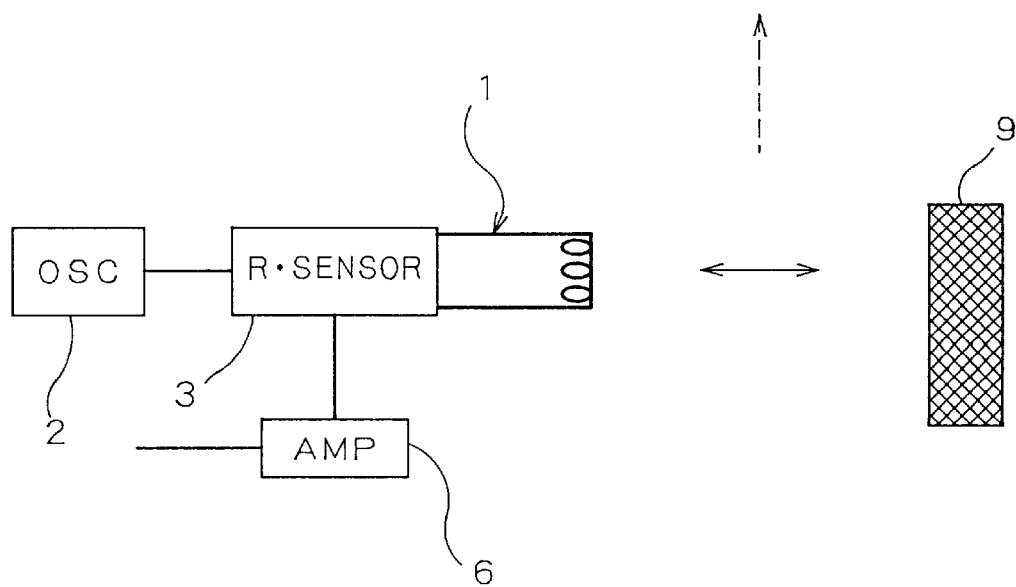

FIGS. 15(a) and (b) show a detection of a distance L between the sensor 1 and a sample 9 to be measured. As the sample 9 approaches to the sensor 1 from a distant place as shown in FIG. 15(b), the output voltage V from the amplifier 6 rises as shown in FIG. 15(a). By proofreading a curve of a distance L and an output voltage V in advance, the distance between the sensor 1 and the sample 9 can be detected.

A mechanism for moving the sensor 1 up and down in FIGS. 6 to 14 will be explained later in conjunction with FIGS. 39 to 42.

Figure 16:
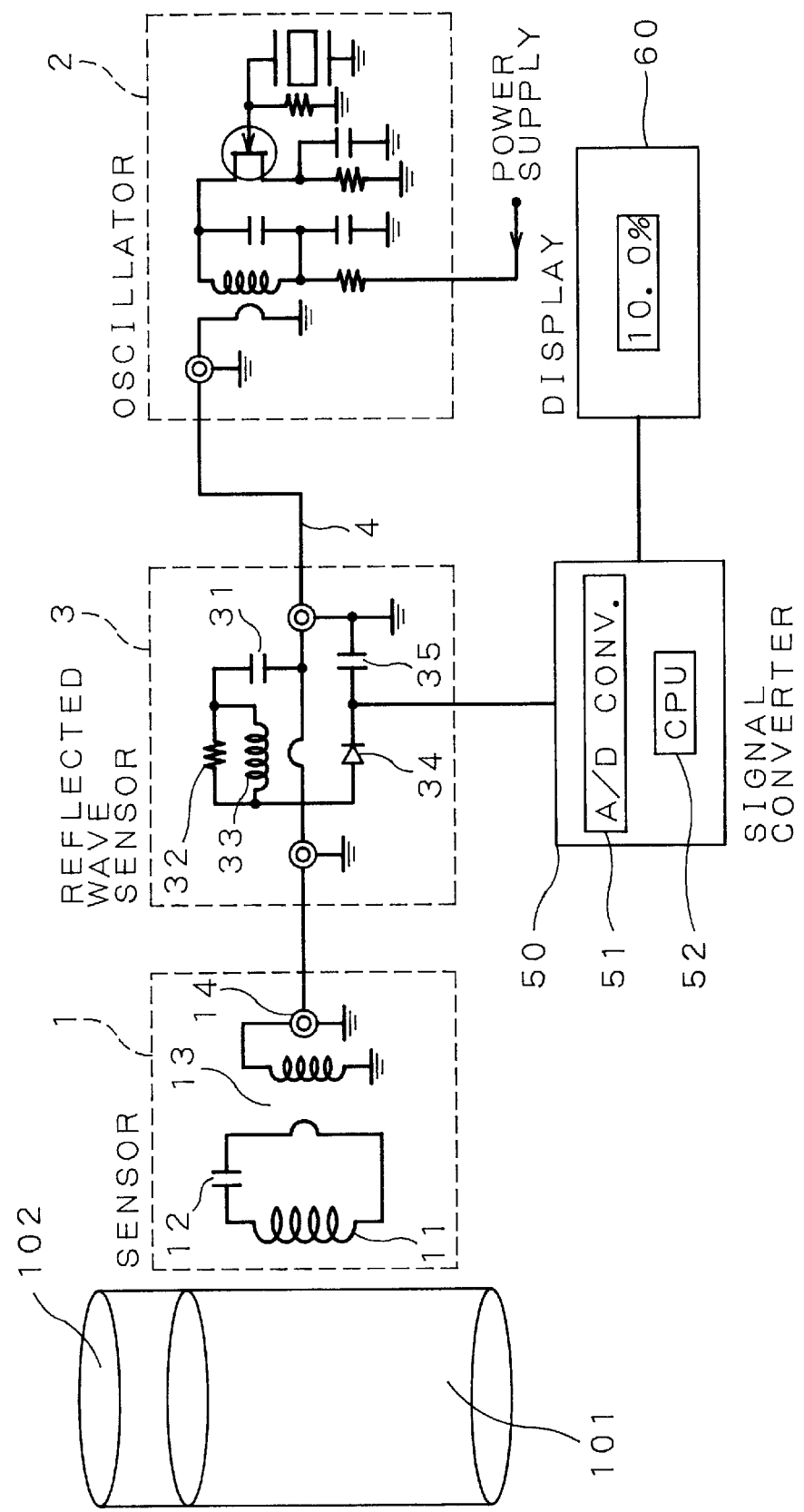
FIG. 16 is a circuit diagram of a liquid concentration sensing device as a second embodiment of this invention.

In FIG. 16 there is shown a circuit diagram of a liquid concentration sensing device as a second embodiment of this invention. The same components of FIG. 16 as those of the sensing device of FIG. 1 are represented by the same reference numerals. The concentration sensing device of this second embodiment includes sensor 1, oscillator 2 for transmitting a high frequency signal through transmission path 4 to the sensor 1, reflected wave sensor 3 as a detector detecting a reflection signal of the high frequency signal applied to the sensor 1 which is reflected by the sensor 1 and returning toward the oscillator 2, a signal converter 50 for converting the detected reflection signal into a concentration signal, and a display 60 for displaying the concentration. The signal converter 50 as a processor includes an A/D converter 51 and a CPU 52, and receives an analog signal from the reflected wave sensor 3 to be converted into a concentration signal (for example, "%") to be generated in a digital signal.

For measuring a concentration of a solution of salt by the liquid concentration sensing device, the sensor 1 is disposed near a container 102 containing a salt solution 101.

In the liquid concentration sensing device the oscillator 2 applies a high frequency signal to the sensor 1 through transmission path 4. Assuming that a resonance frequency of the resonance circuit is set to coincide with the frequency of the oscillator 2 and that an impedance of the sensor 1 and an impedance of the transmission path 4 are matched when a circumstance in the absence of a detected substance is air, the reflection of a transmitted high frequency signal is almost zero and the output from the reflected wave sensor 3 is zero. Since the container 102 of FIG. 6 contains the salt solution 101, the impedance of the sensor 1 is shifted from the matched impedance by a difference of magnetic permeability corresponding to the concentration of the solution 101, whereby a reflection signal having a level relating to the concentration of the solution of salt is generated. The reflection signal is converted into a concentration signal by the signal converter 50 to be displayed by the display 60.

Figure 17:
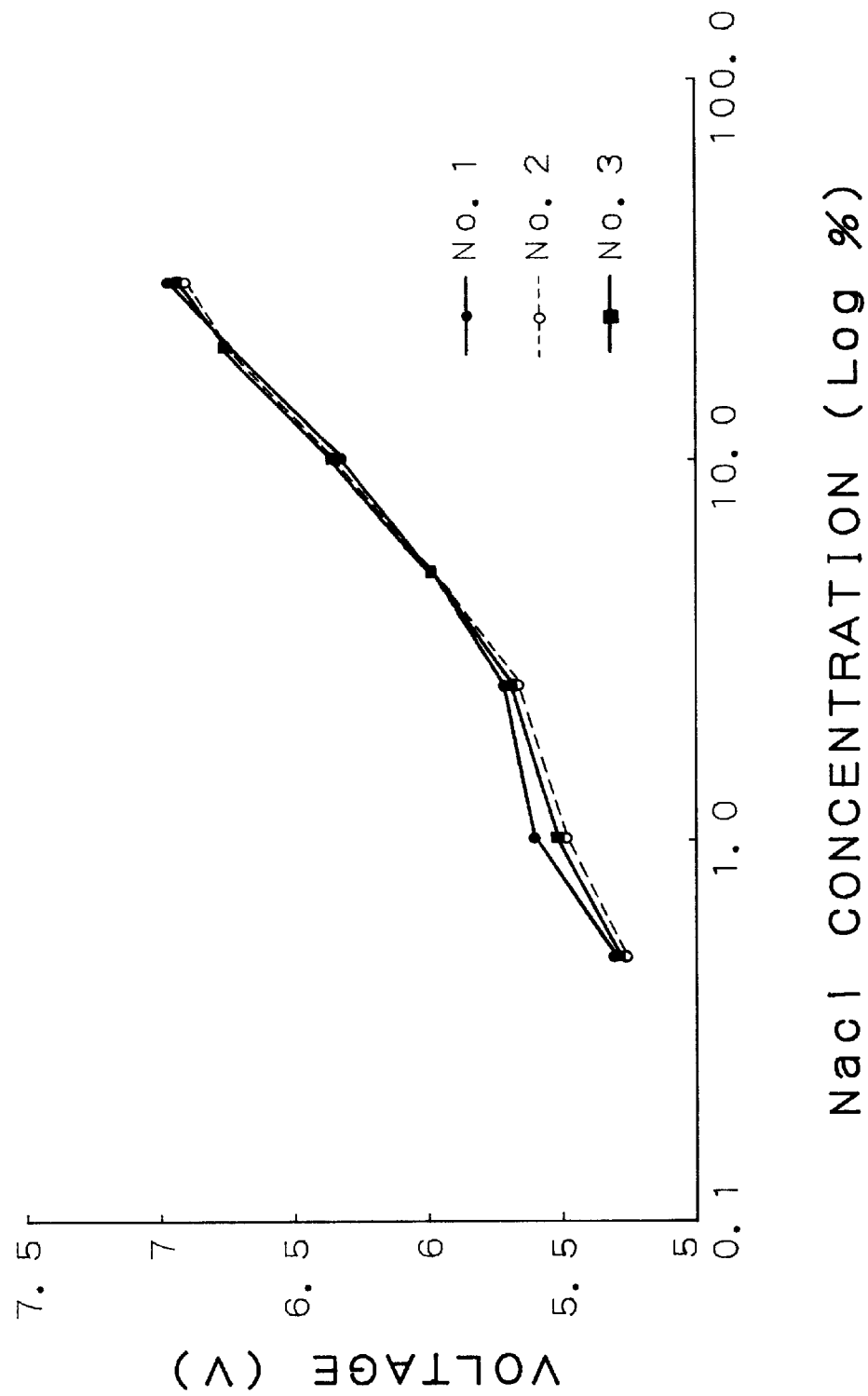
FIG. 17 is a graph of a detection voltage characteristic of the sensing device of FIG. 16 about a liquid concentration.

In FIG. 17 there is shown the relationship between a concentration of the salt solution measured by the liquid concentration sensing device and a detection voltage. The characteristic shown in FIG. 17 is previously stored in the signal converter 50, so that a concentration of salt solution (Log %) is detected from the detection voltage.

Figure 18:
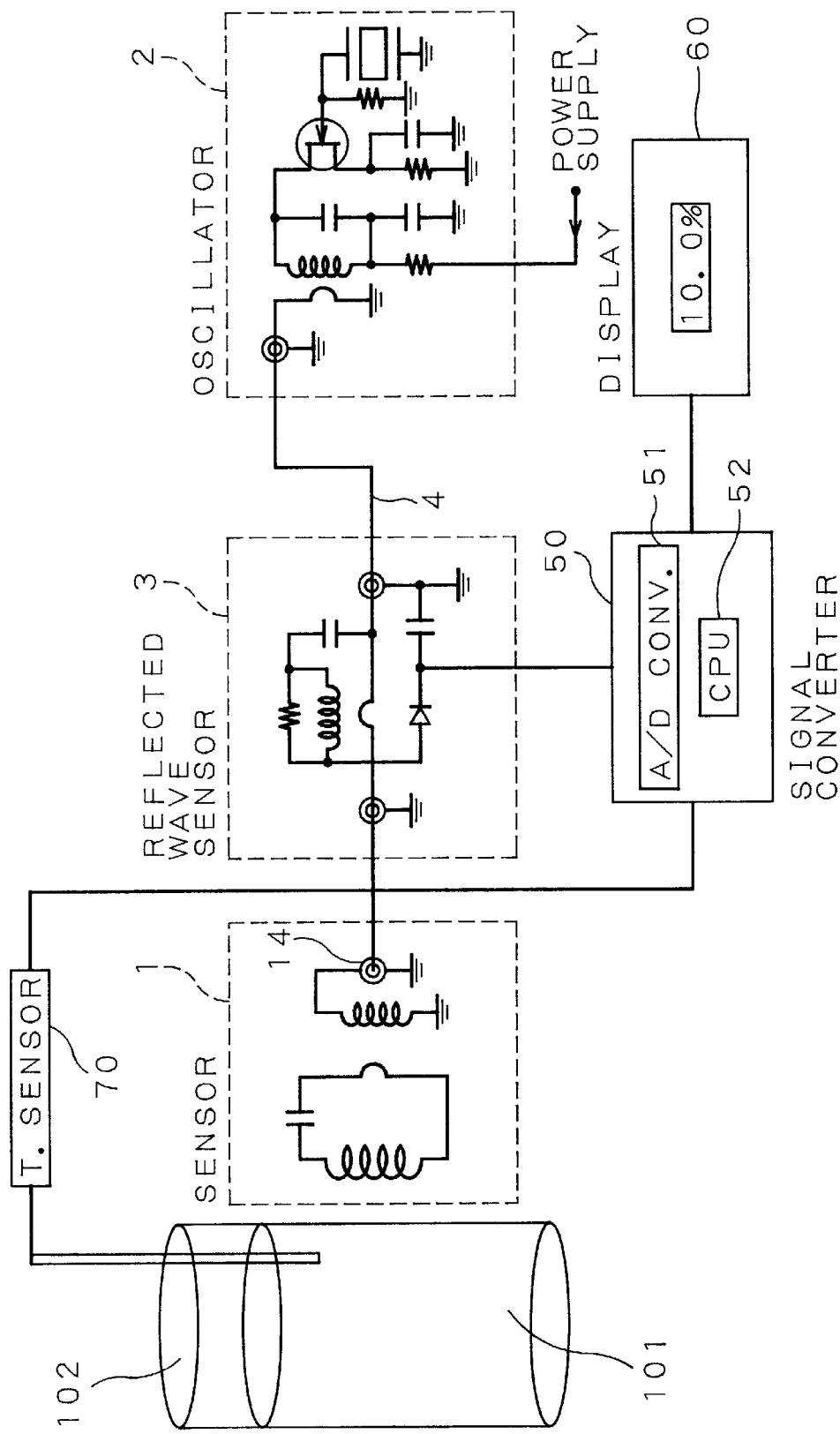
FIG. 18 is a circuit diagram of a liquid concentration sensing device as a third embodiment of this invention.
Figure 19:
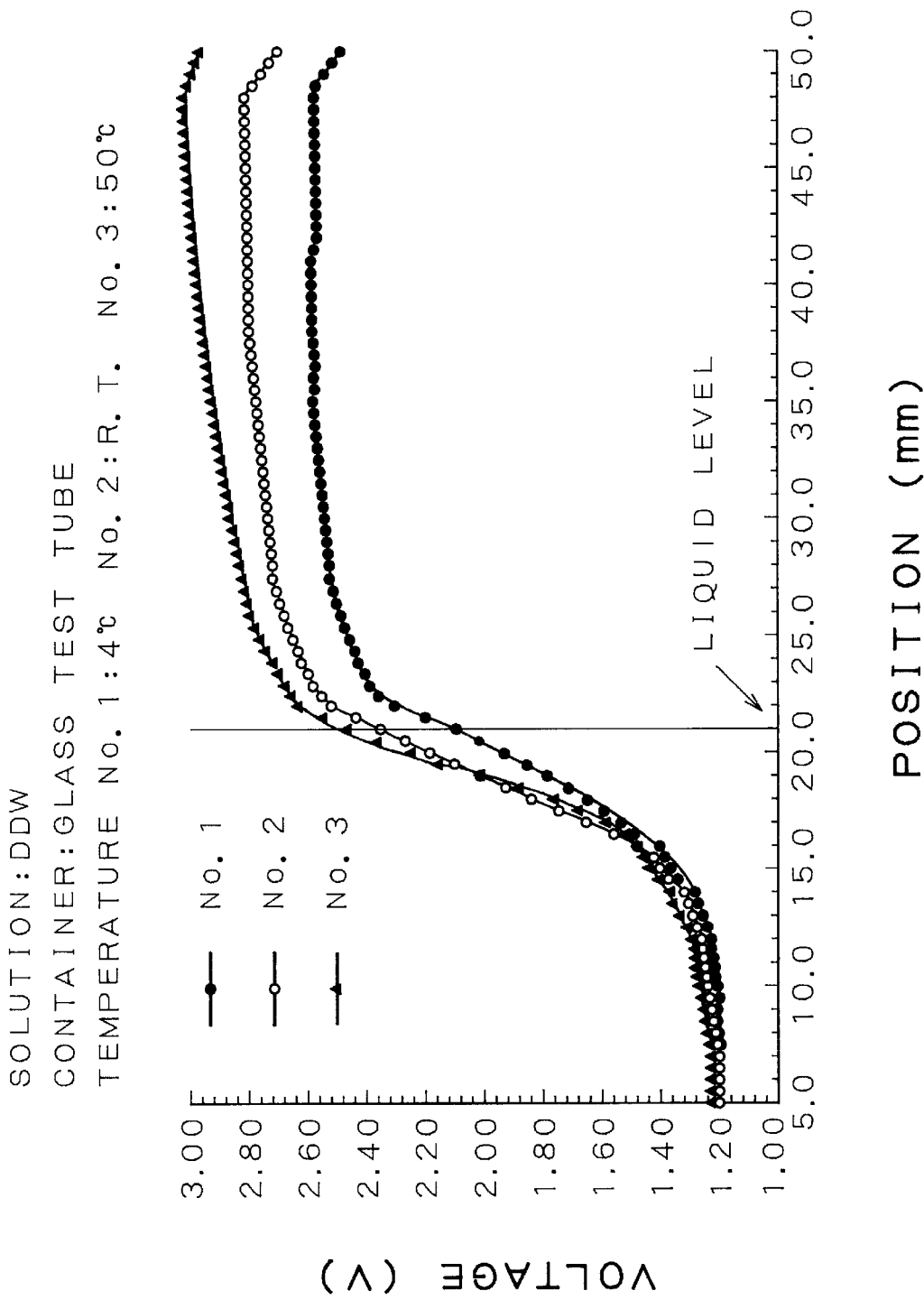
FIG. 19 is a graph showing a detection voltage at each different temperature in the sensing device of FIG. 18.

FIG. 18 shows a circuit diagram of a liquid concentration sensing device as a third embodiment of this invention. This sensing device further includes a temperature sensor 70 in addition to the circuit of FIG. 16. The temperature sensor 70 produces a temperature signal representing temperature of a solution of salt detected by the sensor 70 to be applied to the signal converter 50 to compensate the concentration signal with temperature. The permeability of solution of salt is subject to temperature and causes a measurement error due to ambient temperature. Accordingly the sensing device of this embodiment is provided with temperature compensation to improve the accuracy of the concentration detection. FIG. 19 is a graph showing results of measurement in the sensing device about an output voltage vs. a position of the sensor against a glass test tube container at the temperatures of 4° C., 25° C.(room temperature) and 50° C.

Figure 20:
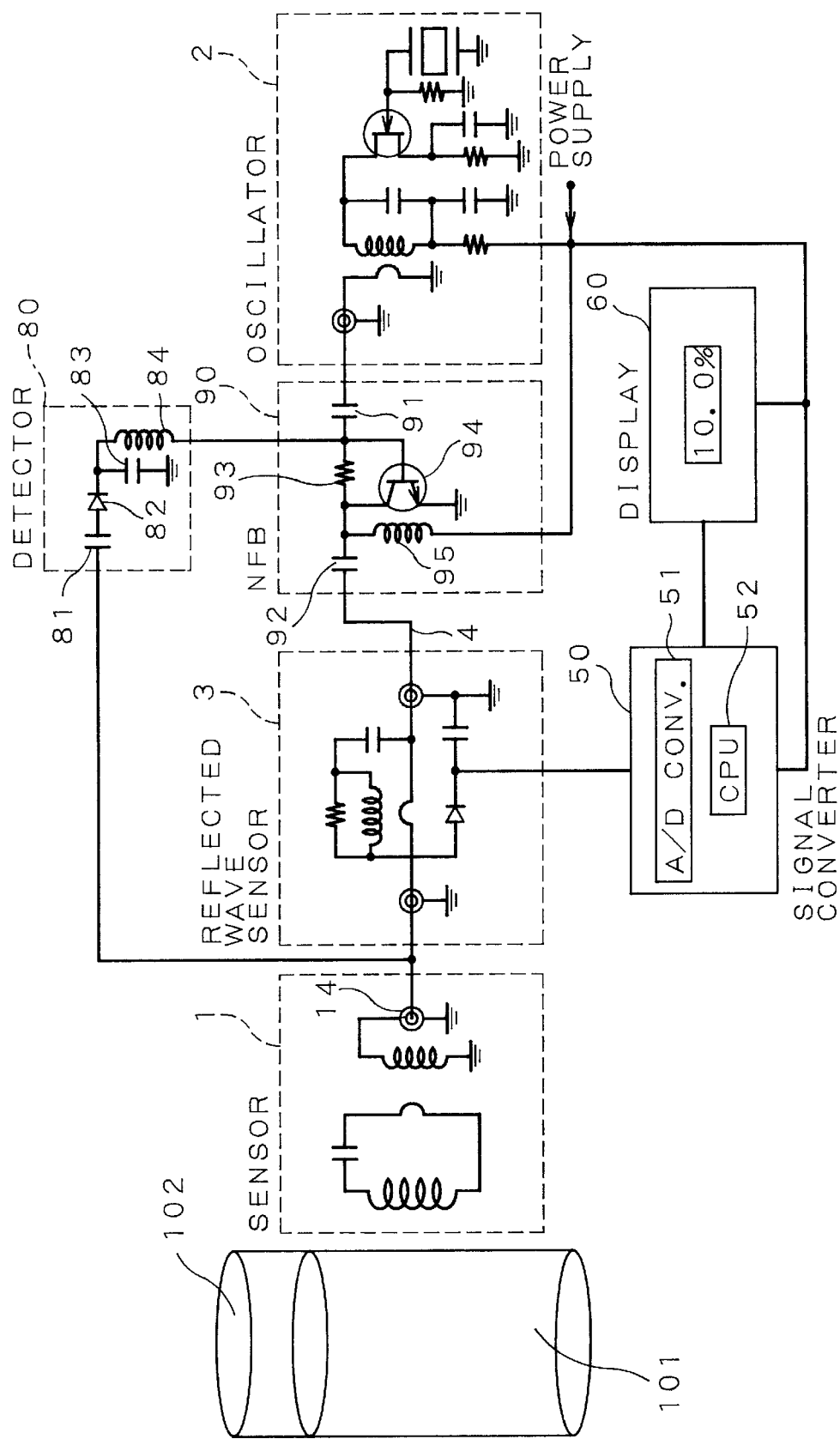
FIG. 20 is a circuit diagram of a liquid concentration sensing device as a fourth embodiment of this invention.

FIG. 20 shows a circuit diagram of a liquid concentration sensing device as a fourth embodiment of this invention. This sensing device further includes a detector 80 and a negative feedback circuit 90 in addition to the circuit of FIG. 16. The detector 80 includes a capacitor 81, a diode 82, a capacitor 83 and a coil 84. The capacitor 81 at one end thereof is connected with terminal 14 of the detector and at another end thereof is connected with an anode of the diode 82. A cathode of the diode 82 is grounded through the capacitor 83 and connected with one end of the coil 84. The negative feedback circuit 90 includes capacitors 91 and 92, a resistor 93, a transistor 94, and a coil 95. The capacitor 91, the resistor 93 and the capacitor 92 are connected in series and interposed between the oscillator 2 and the reflected wave sensor 3. A collector and a base of the transistor 94 are connected across the resistor 93, and a base of the transistor is connected with other end of the coil 84. The coil 95 is interposed between a power supply and the collector of the transistor 94.

When a faint signal, like one for detecting a concentration of a solution of salt, is necessary to be processed, the stability of the detector is important. The temperature characteristic of components in use affects the accuracy of the detector, so that stabilization is important. For this purpose, an output signal is extracted from the detector 80 to be detected, and fed back by the negative feedback circuit 90 for stabilization of the output. The detector 80 converts the high frequency power supplied to the sensor 1 into a direct current signal. The negative feedback circuit 90 receives the signal from the detector 80. The circuit 90 decreases its amplification ratio when the received signal is high, but increases the ratio when the signal is low, whereby the power supplied to the sensor 1 is kept constant. The negative feedback circuit 90 may be replaced with an automatic gain control (AGC) circuit if desired. The transistor 94 also may be replaced with a FET or a PIN diode.

Figure 21:
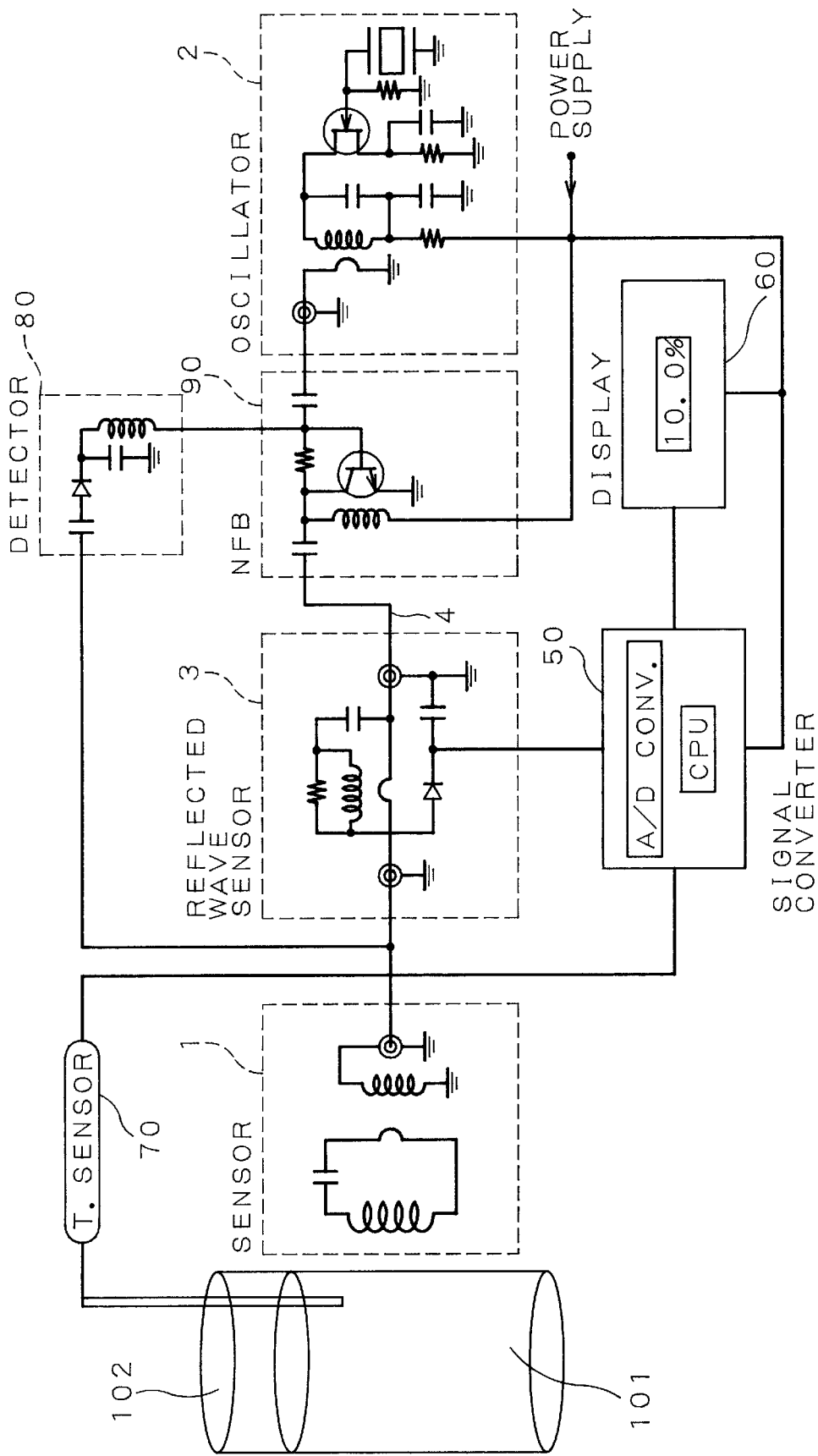
FIG. 21 is a circuit diagram of a liquid concentration sensing device as a fifth embodiment of this invention.

FIG. 21 shows a circuit diagram of a liquid concentration sensing device as a fifth embodiment of this invention. This sensing device further includes a temperature sensor 70, a detector 80 and a negative feedback circuit 90 in addition to the circuit of FIG. 16. This device provides a further improved stability in the variation of the output signal by temperature compensation and negative feedback.

A temperature measurement can be executed by utilizing the above-described relation of concentration and temperature. An aqueous solution having a temperature dependent concentration is employed, and relation between the concentration and temperatures is stored in a table of the sensing device. The concentration measured by the device is converted into a temperature by accessing the table to display the temperature for temperature measurement.

Figure 22:
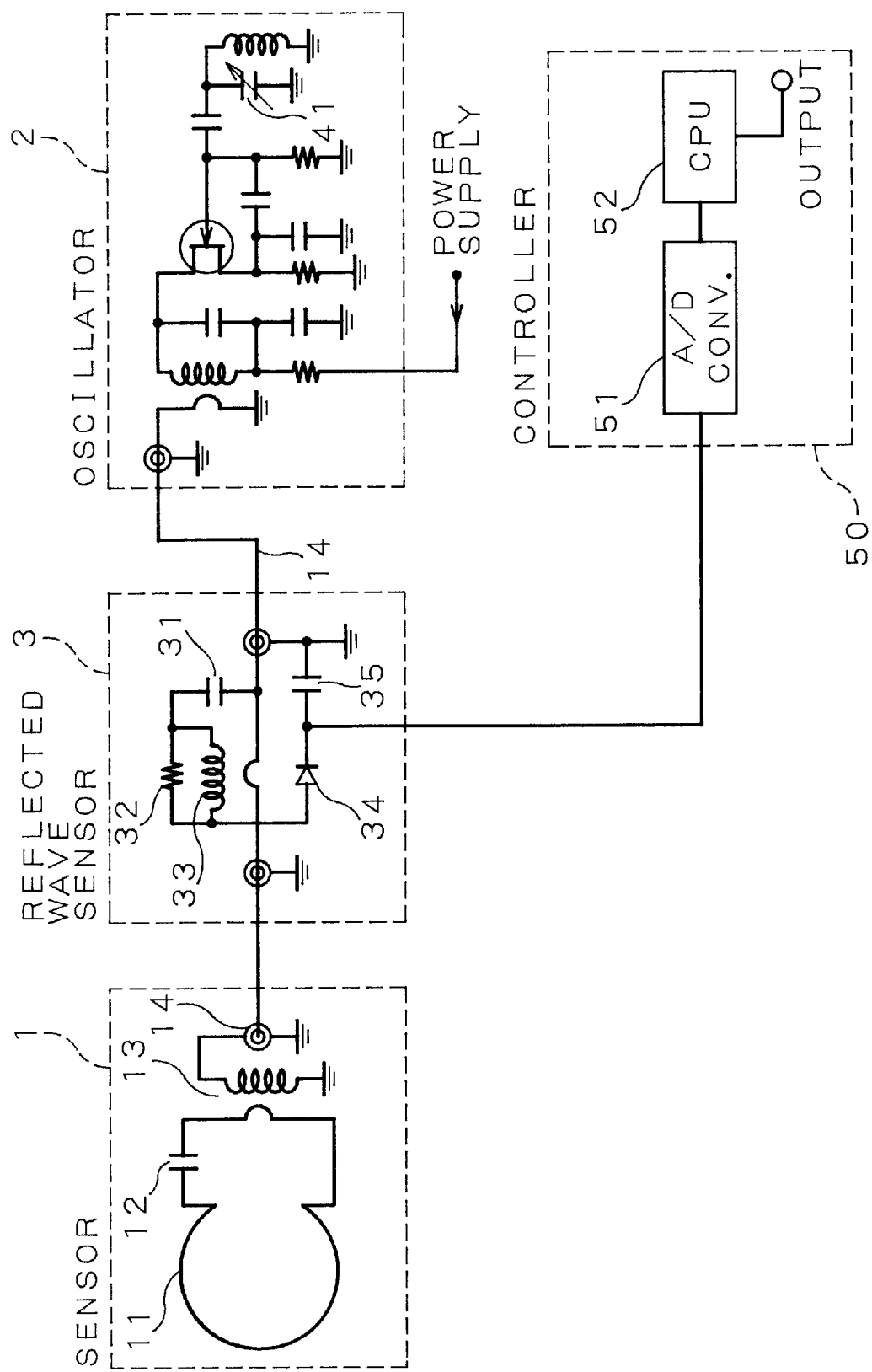
FIG. 22 is a circuit diagram of a human body sensing device as a sixth embodiment of this invention.
Figure 23:
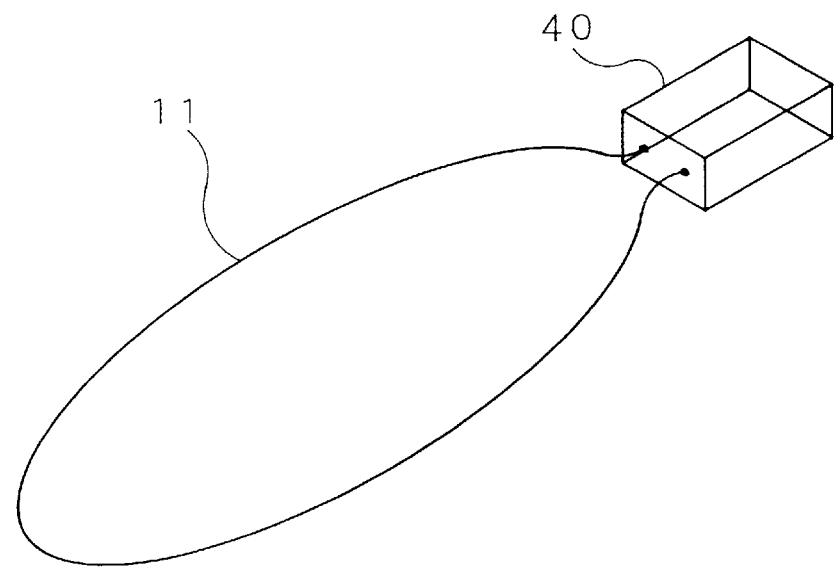
FIG. 23 is a detection coil employed in the sensing device of FIG. 22.

In FIG. 22 there is shown a circuit diagram of a human body sensing device as a sixth embodiment of this invention. The sensing device includes a sensor 1, an oscillator 2 transmitting a high frequency signal to the sensor 1 through a transmission path 4, a reflected wave sensor 3 for detecting a reflection signal which is reflected by the sensor 1 and returns toward the oscillator 2, a controller 50 for processing the detected reflection signal. The basic construction is the same as those of the above-mentioned sensing devices.

The sensor 1 includes a detection coil 11, a resonance capacitor 12 forming a series resonance circuit with the coil 11, and a real number transformer 13 in which a primary coil is connected with the resonance circuit and a secondary coil is connected with a high frequency input terminal 14 and an earth GND. The serial resonance circuit may be replaced with a parallel resonance circuit if desired.

Figure 24:
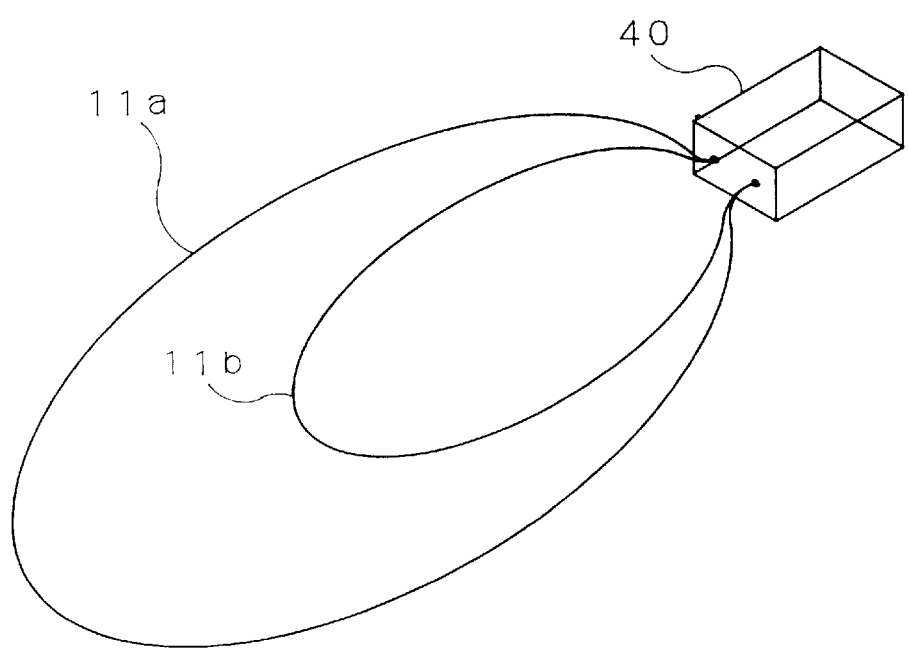
FIG. 24 is a modification of the detection coil of FIG. 23.

The detection coil 11 employs a circle one turn air-core coil having a diameter 200 mm corresponding to a measured portion of the human body, the buttocks. The sensor 1 other than the coil 11, the oscillator 2, the reflected wave sensor 3 and the controller 50 are housed within a housing 40. If desired, the detection coil 11 may be modified to have a coil 11a having a diameter 200 mm and a coil 11b having a diameter 100 mm which are selectively used or connected in series as shown in FIG. 24.

Figure 25:
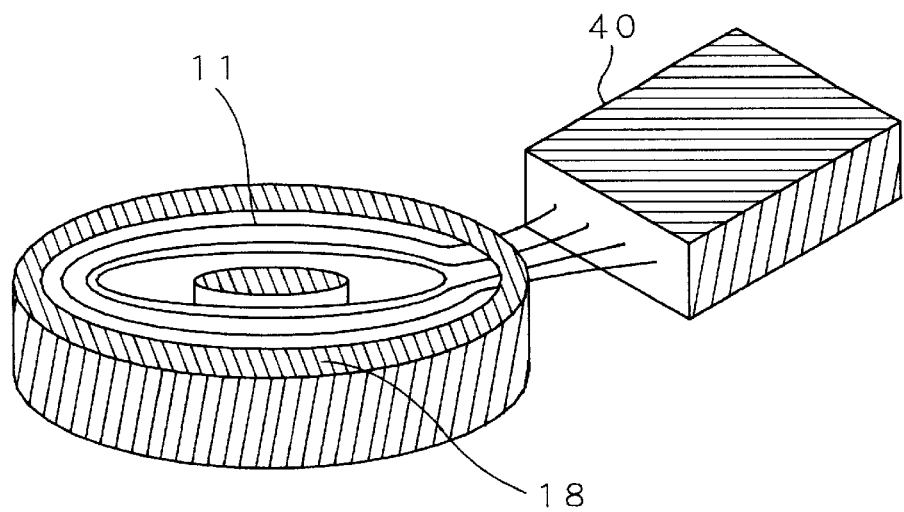
FIG. 25 is another detection coil which may be employed in the human body sensing device of FIG. 22.

As shown in FIG. 25 as a further modification of the detection coil, the detection coil 11 may be wound around a magnetic core 18 having an E-shaped section so that a magnetic field can be generated only in one direction lying at right angles to a wall of the coil 11. If desired, number of turns and a diameter of the coil 11 may be changed in accordance with the object to be detected. The conductive wires of the detection coil 11 employs a good conductive metal about a high frequency signal such as Au(gold), Ag(silver), Cu(copper), Al(aluminum) and so forth. By constructing the detection coil 11 with such good conductive metal the sensitivity is improved and a high frequency power loss is reduced.

The oscillator 2 employs a LC resonance type oscillator. The oscillation circuit itself may be other conventional high frequency oscillation circuit such as a crystal oscillator or PLL. The oscillator 2 employs a variable capacitor 41. By automatically changing the capacity of the capacitor 41 the frequency of the high frequency signal generated from the oscillator 2 is scanned, for instance, between 30 MHz and 50 MHz. A scanning mechanism may be provided in the oscillator itself, or the frequency may be changed according to an instruction generated from the controller 50.

The reflected wave sensor 3 is the same component as those of FIGS. 1 and 16. The controller 50 includes an A/D converter 51 and a CPU 52, and converts an analog signal from the reflected wave sensor 3 into a digital signal for a logical process in view of the reflection level and frequency to execute a judgement detecting process for vacancy, baggage or seating of the human body.

Figure 26:
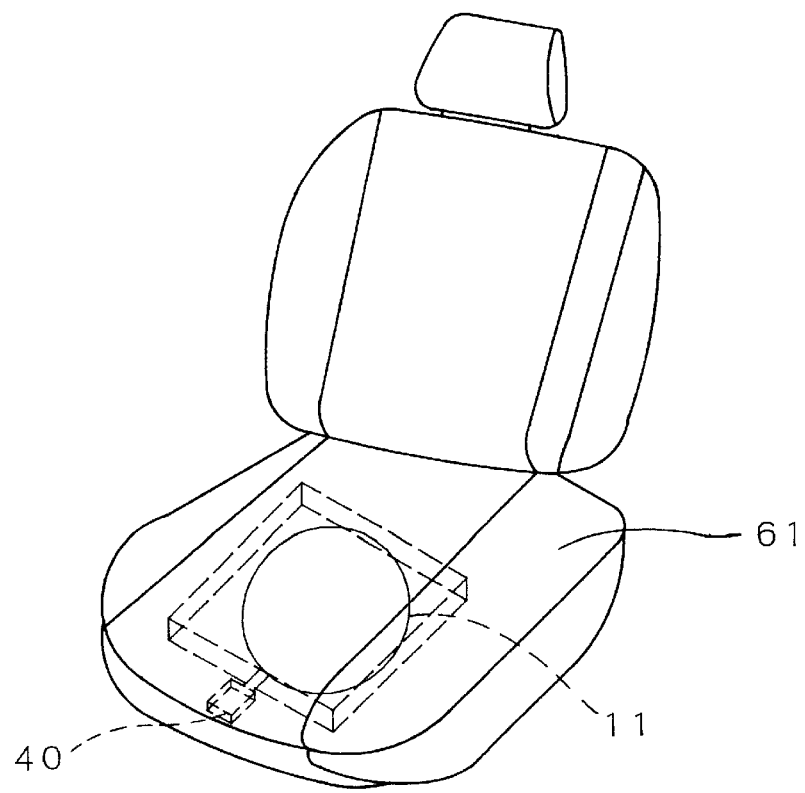
FIG. 26 shows a seat in which the human body sensing device is installed.
Figure 27:
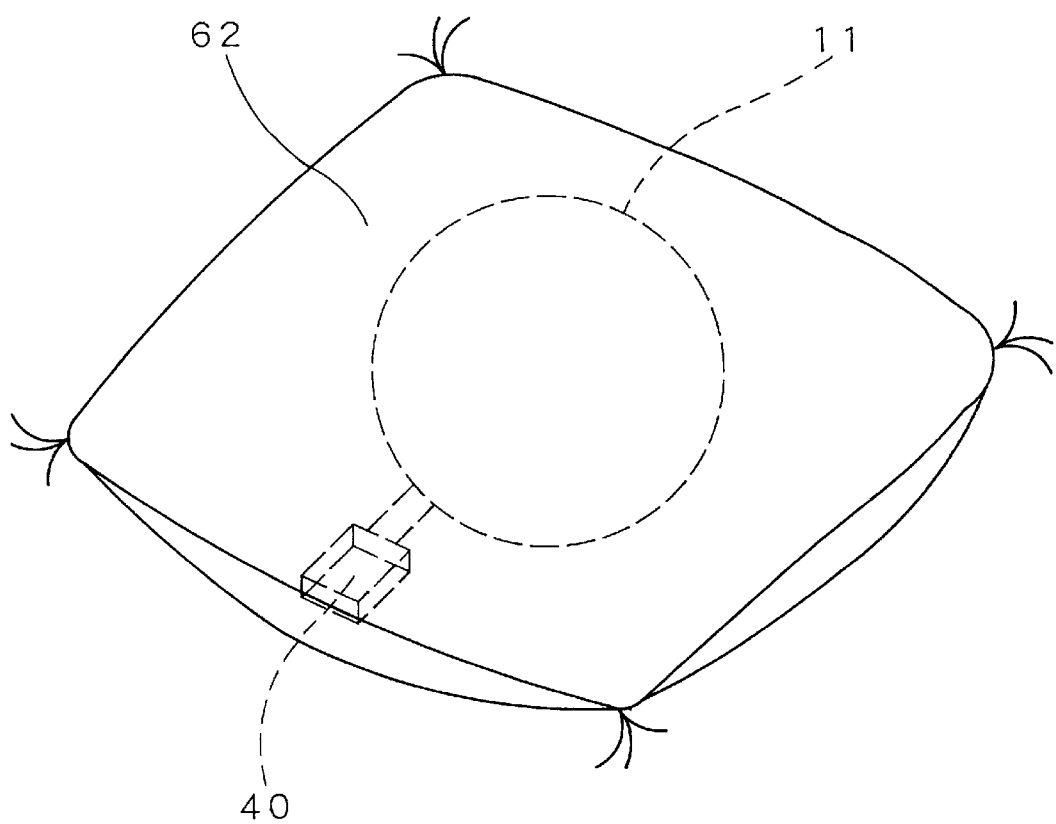
FIG. 27 shows a cushion containing the sensing device.

The human body sensing device of this embodiment is buried within a bottom of a seat (in an automobile, a train, a theater and so forth) 61 as shown in FIG. 26 or within a seat cushion 62 as shown in FIG. 27. The device may be buried within other portions of a seat such as a support for the back of the seat.

The oscillator 2 generates a high frequency signal to be applied to the sensor 1 through the transmission path 4. The high frequency signal of the oscillator 2 is scanned between 30 MHz and 50 MHz. The high frequency signal supplied to the sensor 1 is reflected by the sensor 1. The impedance of the sensor 1 varies with a substance positioned near the detection coil 11 due to the difference of magnetic permeability of the substance to change the level of the reflected wave produced by external circumstance near the detection coil. The reflected wave is detected by the reflected wave detector 3, and the controller 50 detects vacancy, baggage or the human body in view of the reflection level and frequency.

Figure 28:
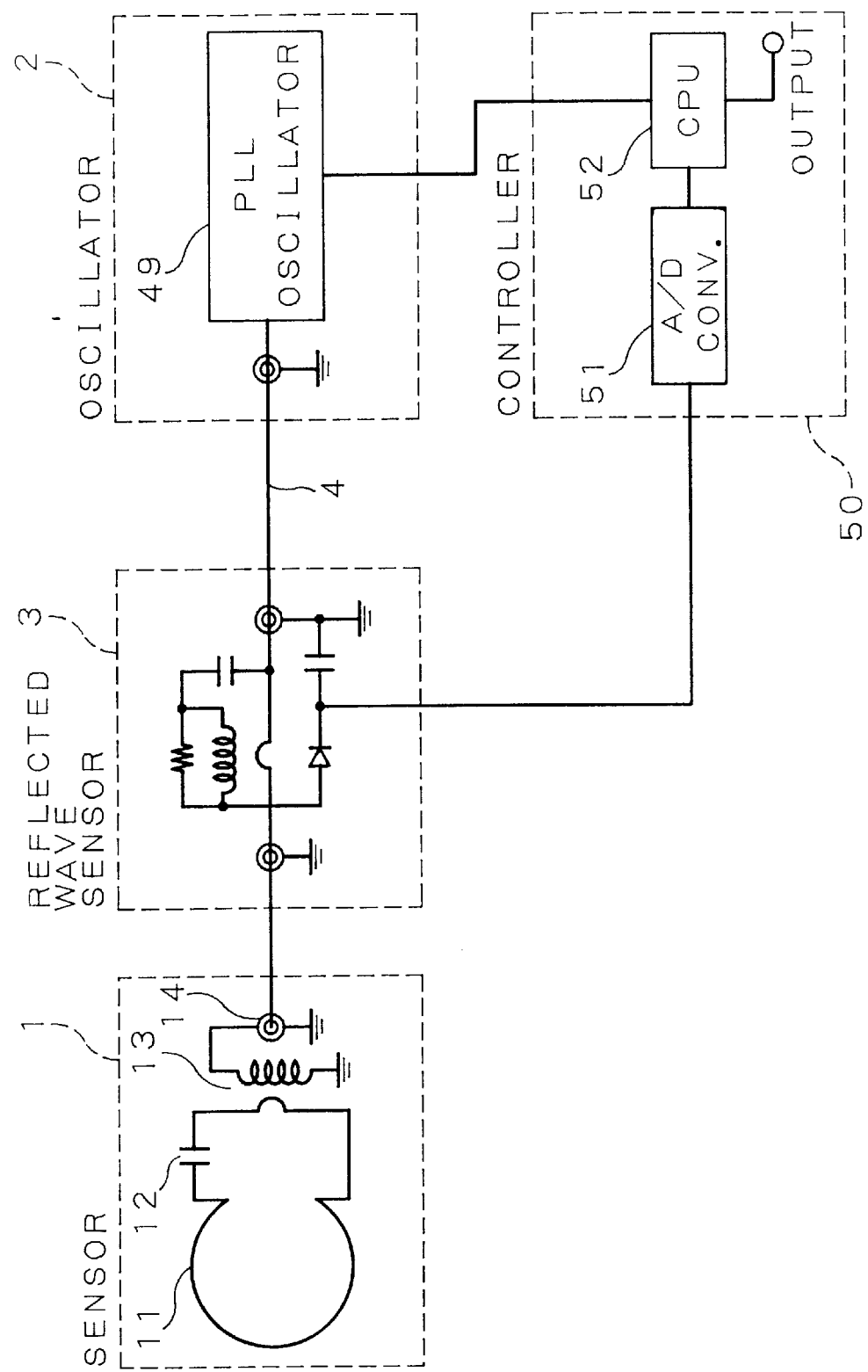
FIG. 28 is a circuit diagram of a human body sensing device as a seventh embodiment of this invention.

FIG. 28 shows a circuit diagram of a human body sensing device as a seventh embodiment of this invention, in which a sensor 1 and a reflected wave sensor 3 are same as those of FIG. 22. An oscillator 2 employs a PLL oscillator 49 different from the oscillator 2 of FIG. 22, and changes the high frequency according to an instruction from the CPU 52 of the controller 50.

Figure 29:
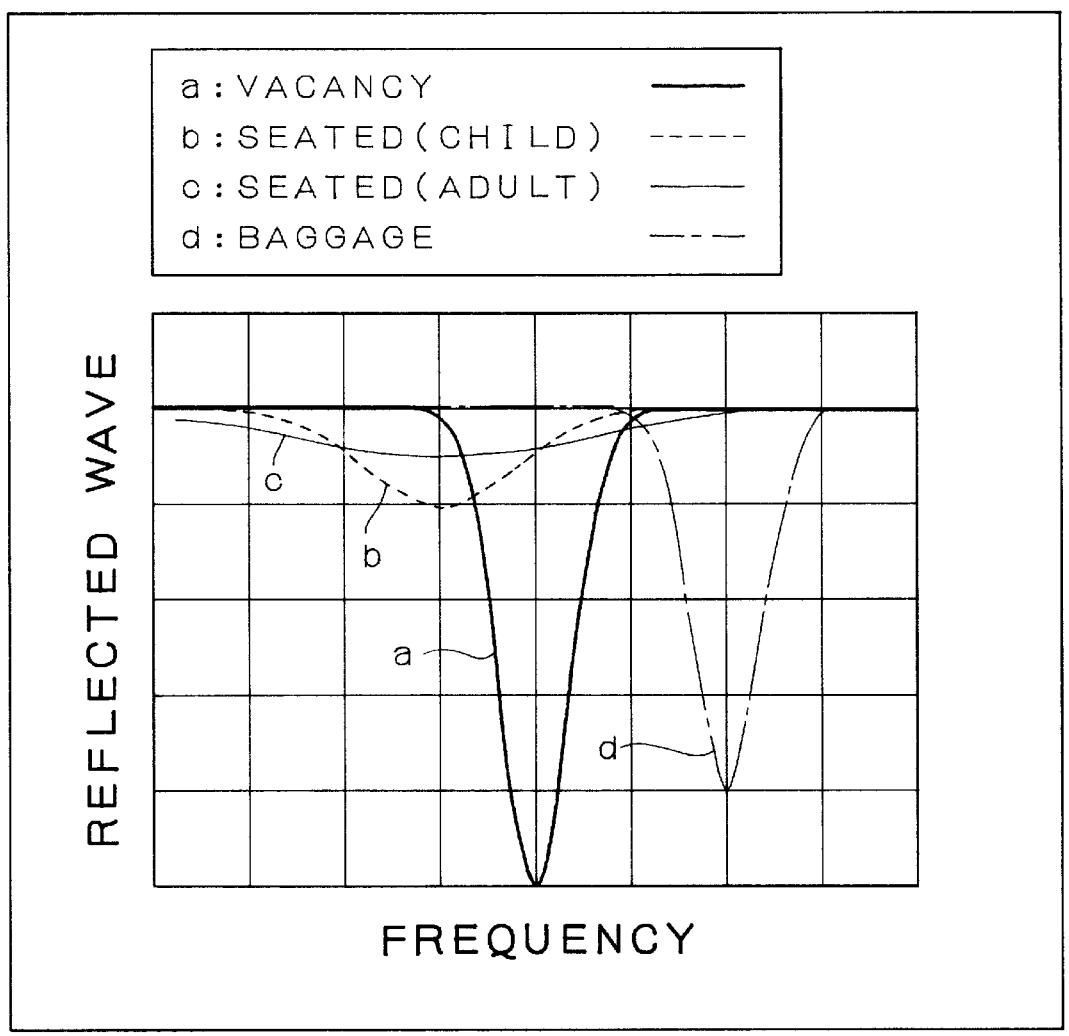
FIG. 29 is a graph showing relation between a frequency of an oscillator of the human body sensing device and a reflected wave when the seat is vacant, or occupied by a child, an adult or a baggage.

As the human body sensing device of FIG. 28 is installed into the seat 61 of FIG. 26 or the cushion 62 of FIG. 27 and the oscillator 2 is activated, the characteristic of the reflected wave when the seat is vacant, occupied by a child, occupied by an adult and occupied by baggage is shown by curves "a", "b", "c" and "d" of FIG. 29. In the curve "a" of vacancy and the curve "d" of baggage, the reflected wave is very small at a frequency and the quality factor "Q" is high. In the curves "b" and "c" of seating of the human body, the reflected wave becomes small at a frequency but a degree of the variation of the reflected wave is small and the factor Q is small. Such difference of the frequency characteristic of the reflected wave is made by difference of permeability of vacancy (air), baggage and the human body.

Figure 30:
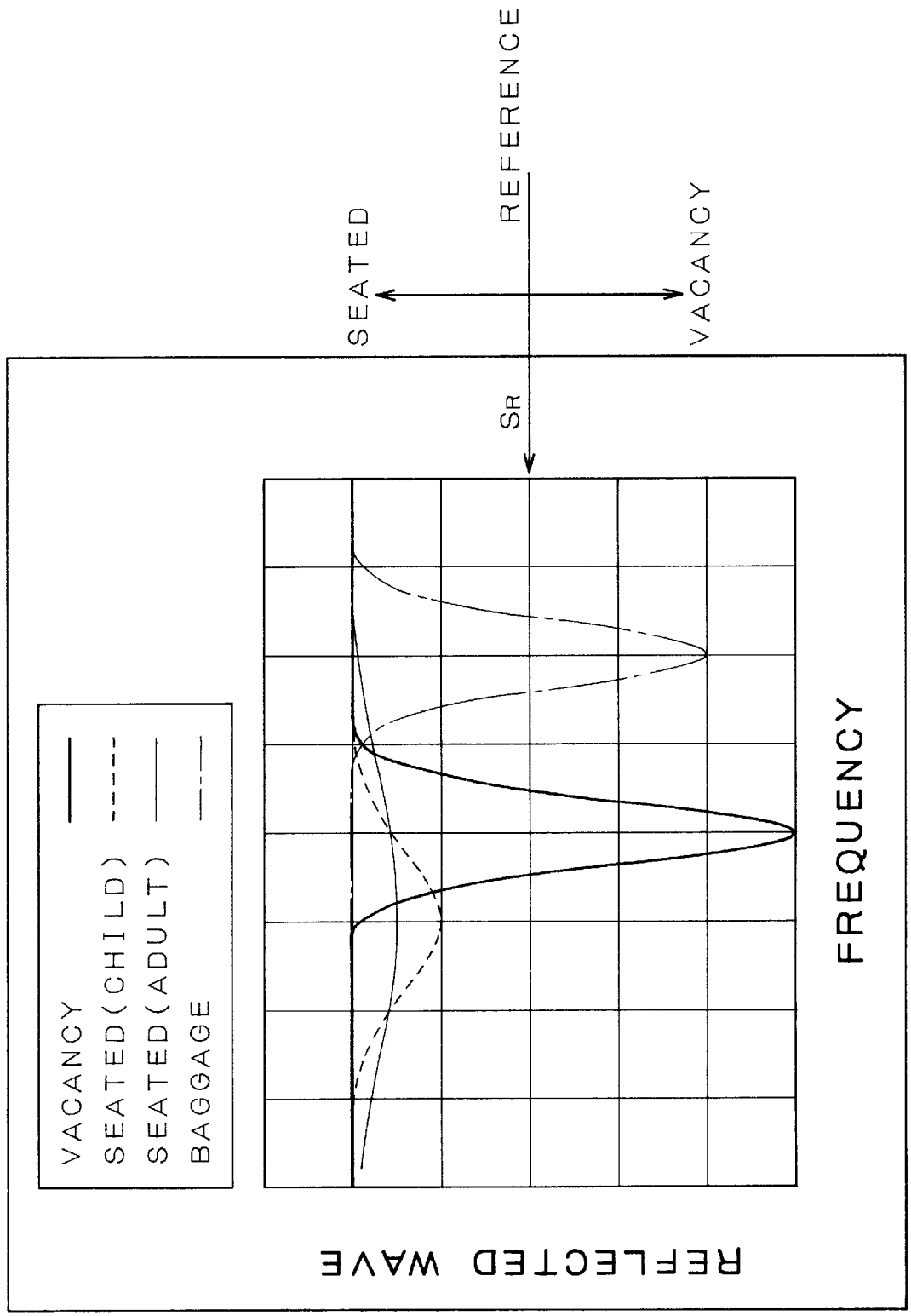
FIG. 30 is a frequency vs. reflected wave characteristic to explain a detection operation about the human body by the sensing device.

FIG. 30 includes the graph of FIG. 29 and a reference indication. If the level of the reflected wave detected by the reflected wave sensor 3 is larger than a reference value $S_R$ over a whole frequency range as shown in FIG. 30, it means that the human body is seated. If there is a frequency where the level of a reflected wave is lower than the reference value $S_R$, it means that the seat is vacancy or put by baggage. The CPU 52 of the controller 50 judges the human body, vacancy and baggage. The same judgement is executed in the human body sensing device of FIG. 22 as well.

Figure 31:
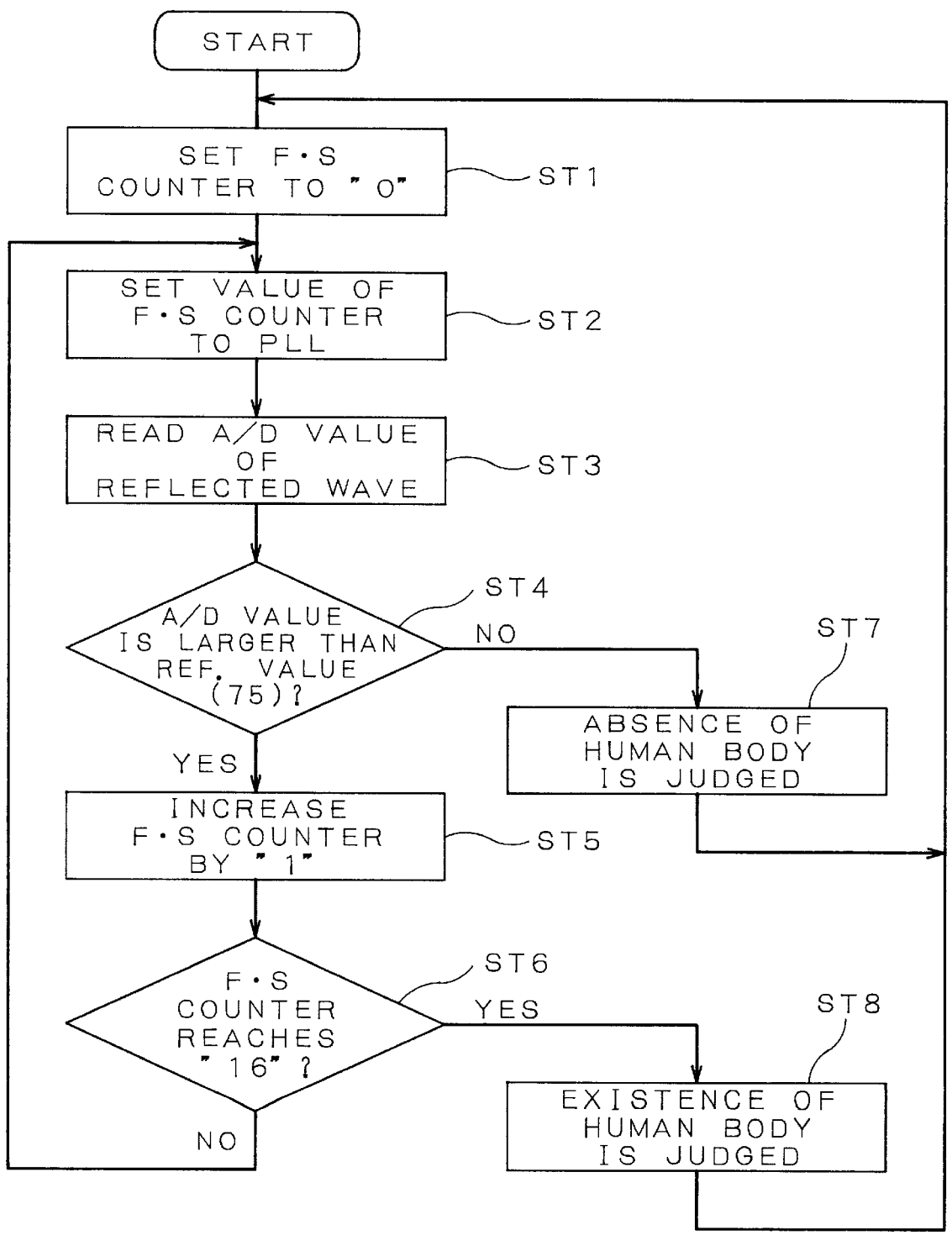
FIG. 31 is a flow chart to showing an seating detection operation by the human body sensing device.

A detection operation by the human body sensing device of FIG. 28 will be described hereinafter in conjunction with a flow chart of FIG. 31.

In the CPU 52 a frequency setting counter is set to "0" (step ST1). Then a count value of the frequency setting counter is set to the PLL oscillator 49 of the oscillator 2 (step ST2). In this sate the oscillator 2 oscillates a high frequency signal of a frequency corresponding to the set value. The high frequency signal is applied to the sensor 1 through the transmission path 4, and a reflection signal according to an external state is detected by the reflected wave sensor 3. The CPU 52 reads the A/D converted value of the reflection wave through the A/D converter 51 (step ST3).

It is inquired if the read A/D value of the reflected wave is a reference value (75) or larger (step ST4). If the read A/D value is the reference value or larger, the frequency setting counter is increased by "1" (step ST5) and it is inquired whether or not the counted value of the frequency setting counter reaches "16" (step ST6). At first the counted value does not reach "16" and the sequence returns to the step ST2 where the counted value of the frequency setting counter increased by "1" is set to the PLL oscillator 49 and the oscillator 2 oscillates at a frequency corresponding to the new counted value. The sequence from the step ST2 to the step ST6 is repeated likewise.

If the A/D value is smaller than the reference value (75) before the counted value of the frequency setting counter becomes 16, a NO response is generated at the step ST4. As shown in FIG. 30 this means that the level of the reflected value is smaller than the reference value $S_R$ at a frequency and the factor Q is high. Accordingly it is judged that the seat is vacancy or put by baggage and that there is not the human body (step ST7). As the counted value of the frequency setting counter becomes "16", one time scanning of frequency change is completed. Unless there is any reflected wave having an A/D value smaller than the reference value at this time point, this means in FIG. 30 that the level of the reflected wave is the reference value $S_R$ or larger over the scanning frequency range. Accordingly, as the counted value of the frequency setting counter becomes "16" at the step ST6, an YES response is generated and the presence of the human body is judged (step ST8).

Figure 32:
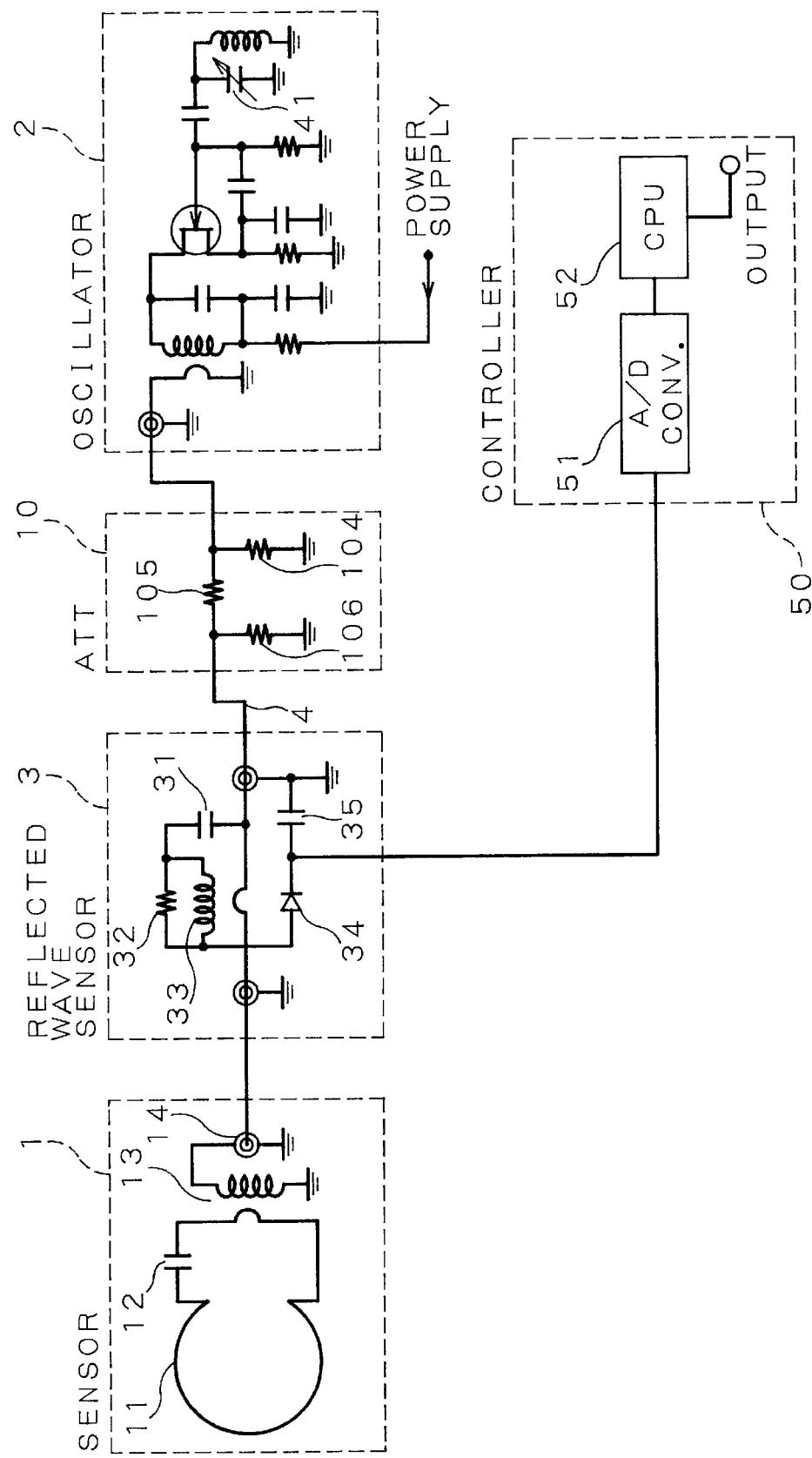
FIG. 32 is a circuit diagram of a human body sensing device as an eighth embodiment of this invention.

FIG. 32 shows a circuit diagram of a human body sensing device as an eighth embodiment of this invention, which includes an attenuator 10 additionally interposed between the oscillator 2 and the reflected wave sensor 3 of FIG. 22. The attenuator 10 employs a E type circuit consisting of resistors 104, 105 and 106, but may employ other type circuit.

As the impedance of the sensor 1 largely varies with a substance to be measured, the signal from the sensor 3 increases. In this time point the load impedance of the oscillator 2 and the input impedance of the sensor 1 are not matched and the operation of the oscillator 2 is unstable. To prevent this unstable operation, the attenuator 10 is disposed at an output side of the oscillator 2 and a part (preferably about 50%) of the output of the oscillator 2 is always consumed by the resistors. Even if the impedance largely varies and matching is not obtained, the oscillator 2 safely operates by stabilizing the load impedance of the oscillator 2. The attenuator 10 may be disposed into the circuit of FIGS. 1, 16, 18, 20, 21, 22, and 28.

Though the level of the reflected wave is detected by the reflected wave sensor 3 in the above-mentioned embodiments, a standing-wave ratio (SWR) may be measured as described later.

As a modification of the foregoing embodiments, the sensing device may be so designed that the high frequency signal generated from the oscillator is applied to the sensor through the transmission path and a phase shift against the high frequency signal transmitted in the detector from the transmission path. As other modification of the foregoing embodiments, the sensing device may be so designed that the high frequency signal generated in the oscillator is supplied to the sensor including a resonance circuit through a transmission path and a voltage or a current in the sensor is detected according to the external status such as vacancy, baggage, the human body or the like to detect a substance. The human body sensing devices of the foregoing embodiments are designed to identify vacancy, baggage and the human body as a human body sensor, but may be applied to a substance sensor for sensing substances other than baggage.

Figure 33:
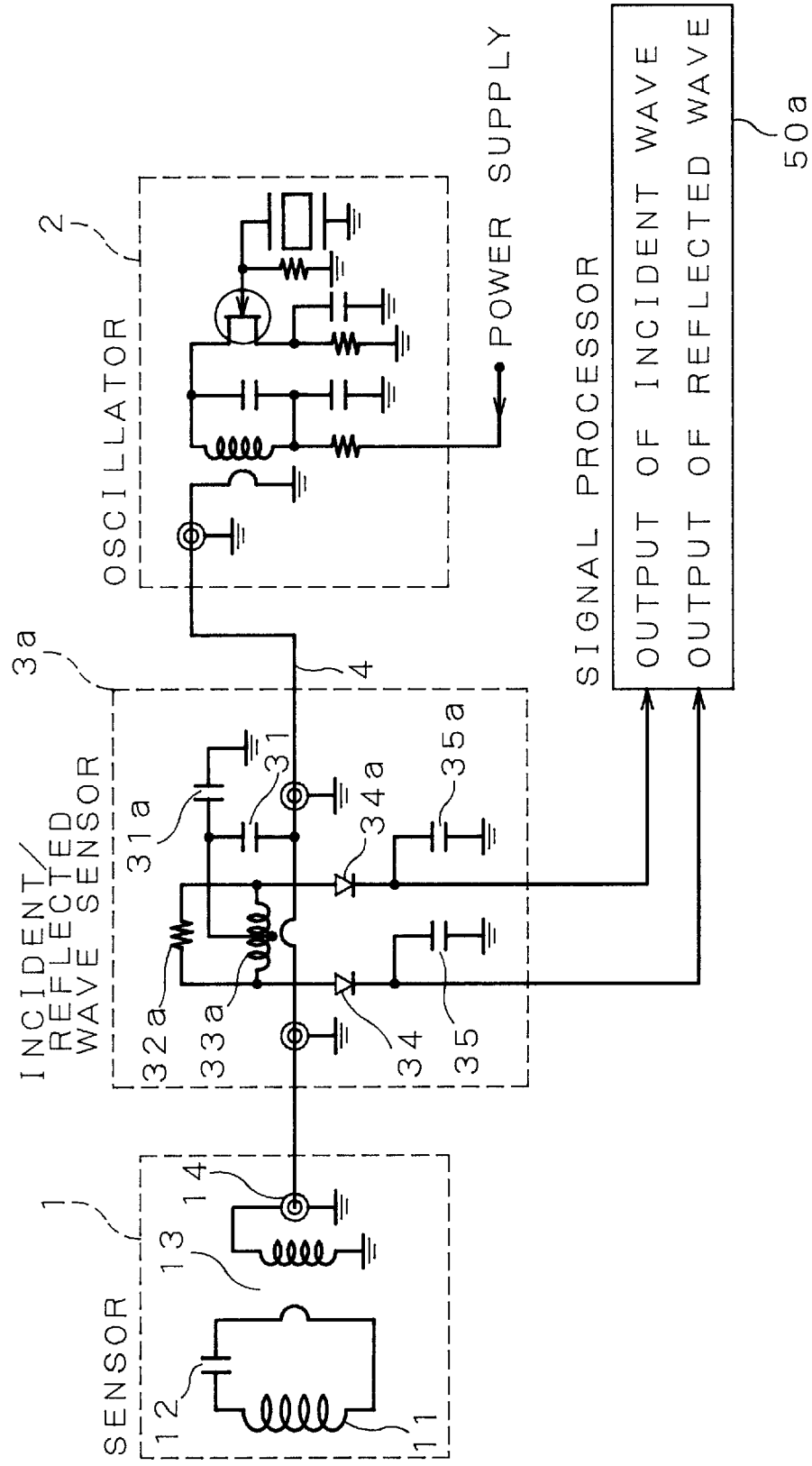
FIG. 33 is a circuit diagram of a powder sensing device as a ninth embodiment of this invention.

In FIG. 33 there is shown a circuit diagram of a powder sensing device as a ninth embodiment of this invention, which includes an oscillator 2 oscillating a high frequency signal, a sensor 1, a transmission path 4, an incident/reflected wave sensor 3a, and a signal processor 50a. The sensor 1 and the oscillator 2 employ the same components as those of FIG. 1. Though the reflected wave sensor 3 of FIG. 1 is designed to sense a reflected wave, the incident/reflected wave sensor 3a of this embodiment is designed to sense a level of an incident wave applied to the sensor 1 through the transmission path 4.

In the incident/reflected wave sensor 3a, a capacitor 31 at one end thereof is connected with the transmission path 4 and at other end thereof is grounded through a capacitor 31a and connected with the middle of a coupling coil 33a. The coupling coil 33a is connected with a resistor 32a in parallel, one end of the parallel circuit is connected with an anode of a diode 34, and a cathode of the diode 34 is grounded through a capacitor 35a. A reflected wave signal and an incident wave signal are generated through diodes 34 and 34a.

The generated incident wave signal and reflected wave signal are computed to produce the standing-wave ratio of the two signals in the signal processor 50a. The presence or absence of powder near the sensor 1 is detected based on the ratio. If the impedance of the sensor 1 and the impedance of the transmission path 4 are matched when there is no powder, the presence of powder changes the impedance of the sensor 1 due to the change of permeability of the powder and makes the matching disappear so that the high frequency signal sent to the transmission path 4 is reflected. The sensing device of this embodiment employs a ratio between the incident wave and the reflected wave, whereby stable detection is performed without worrying about output variation in the oscillator 2. The signal processor 50a computing the ratio of the incident and reflected waves may employ the A/D converter and the CPU of FIG. 16 or an analog arithmetic circuit generating an output relating to the ratio.

Figure 34A:
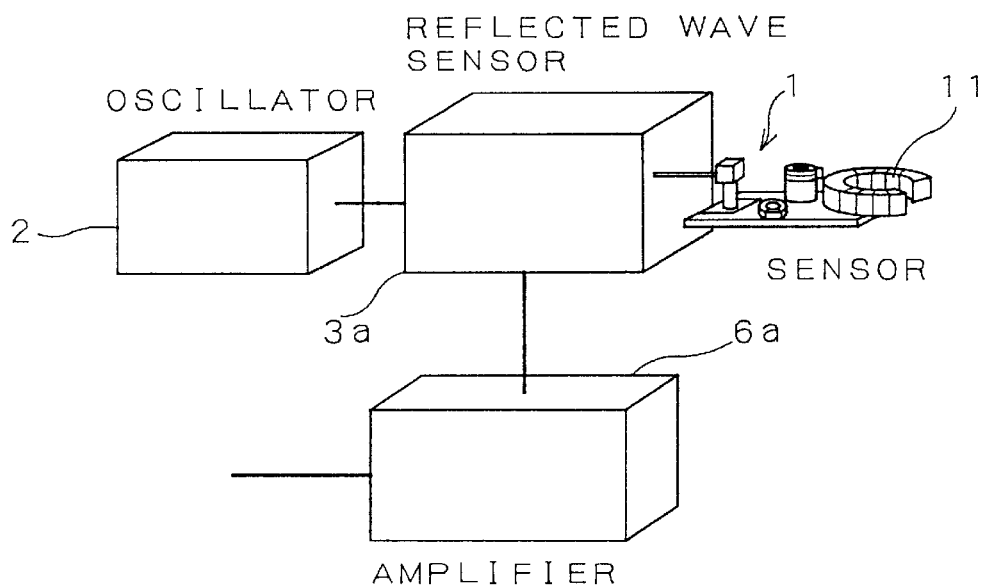
FIG. 34 shows the powder sensing device of FIG. 33 sensing wheat flour.
Figure 34B:
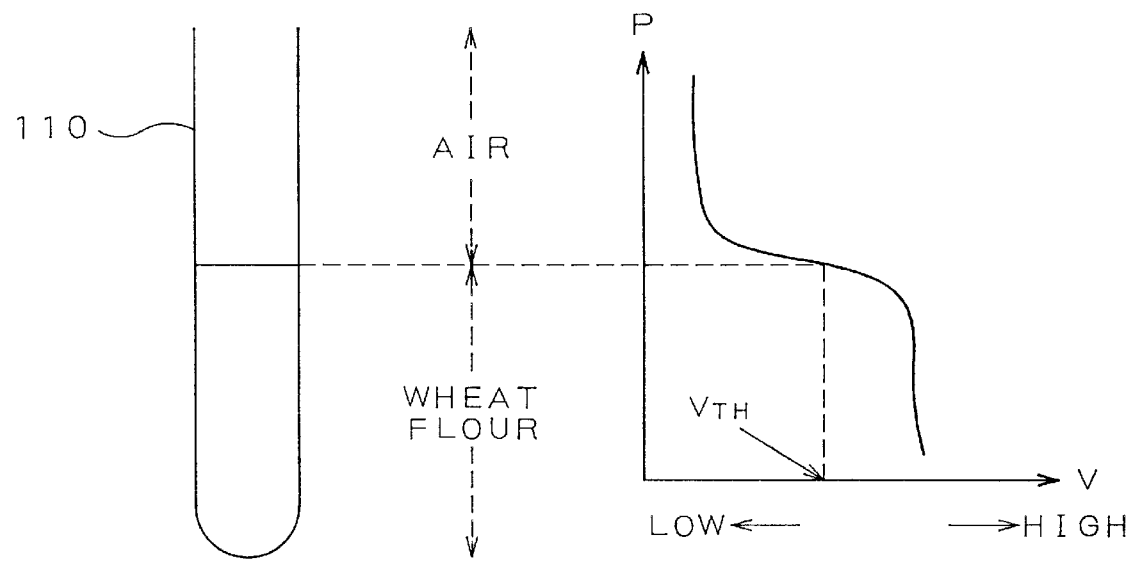
Figure 35:
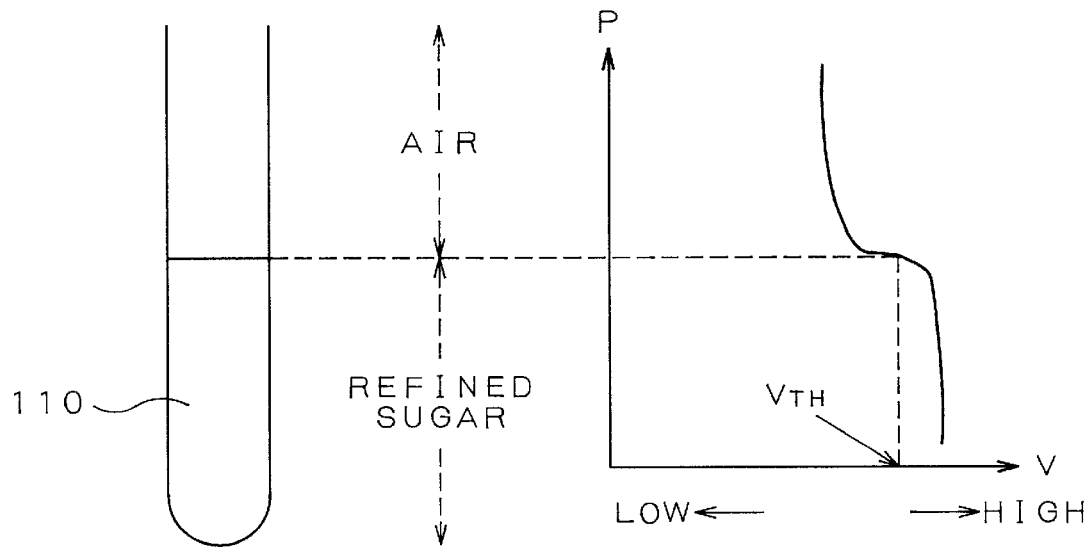
FIG. 35 shows relation between a position of a sensor of the powder sensing device sensing refined sugar within a container and an output voltage of the sensing device.
Figure 36:
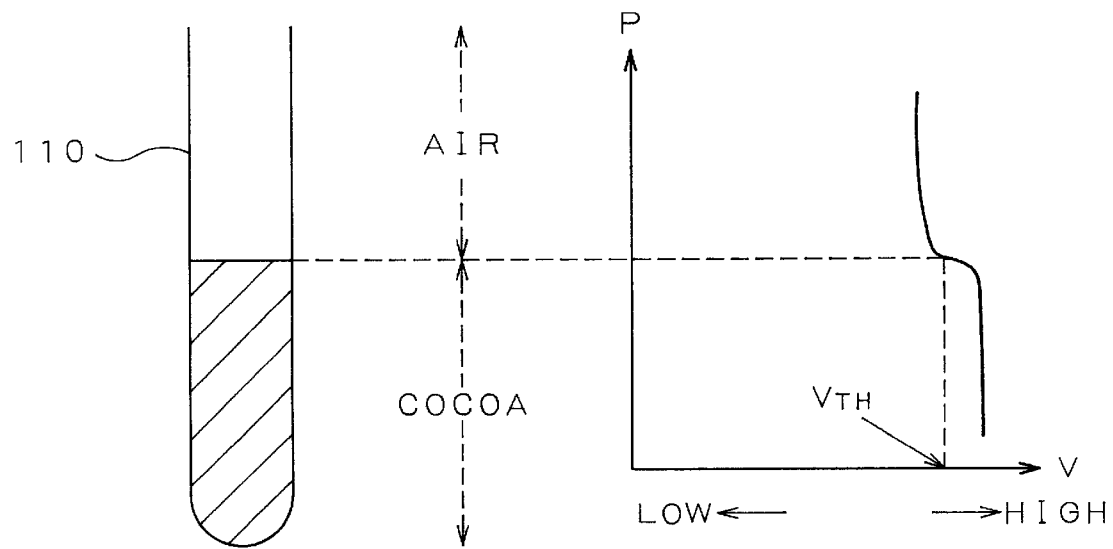
FIG. 36 shows relation between a position of the sensor sensing cocoa within a container and an output voltage of the sensing device.
Figure 37:
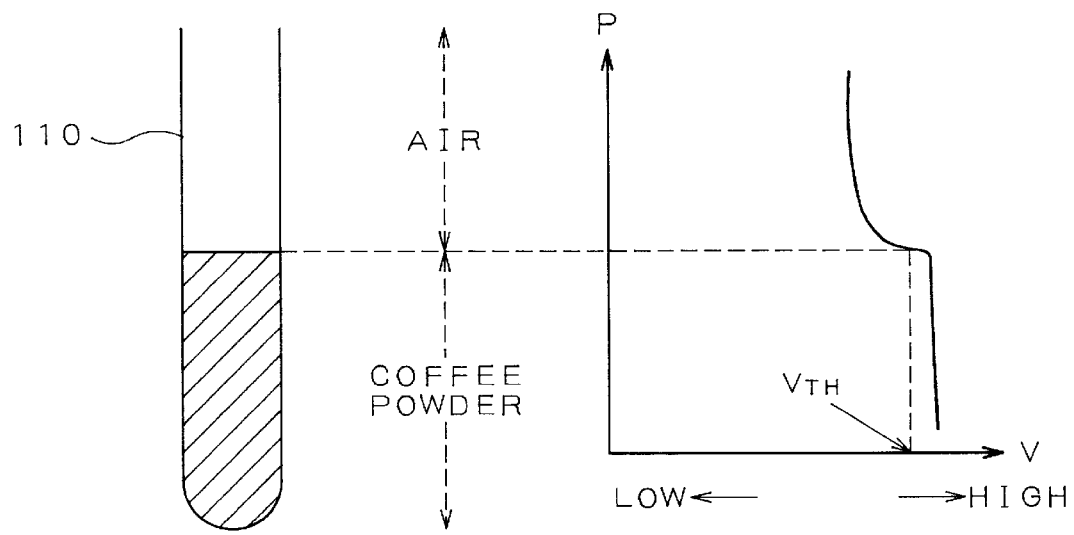
FIG. 37 shows relation between a position of the sensor sensing coffee powder within a container and an output voltage of the sensing device.
Figure 38:
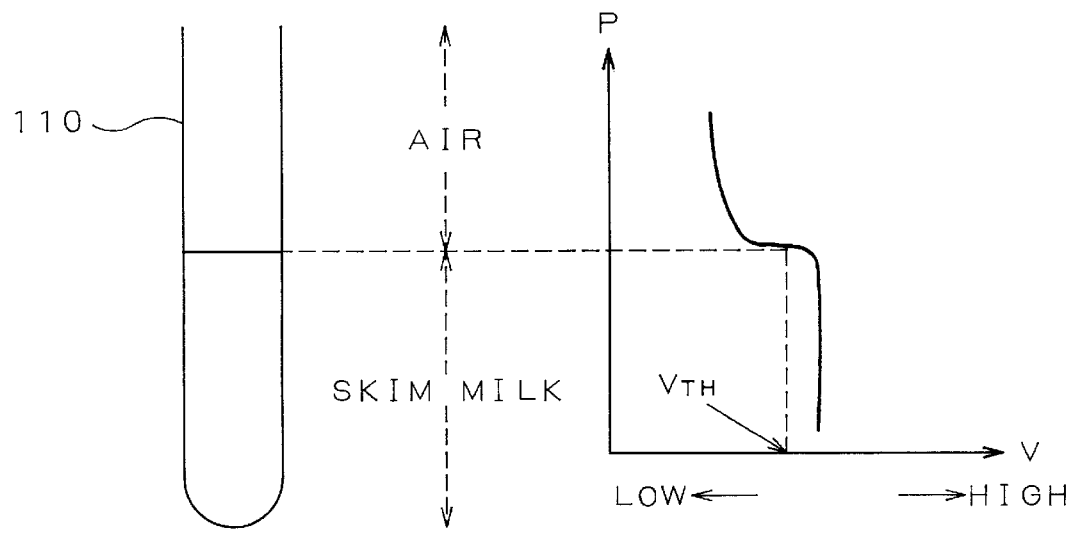
FIG. 38 shows relation between a position of the sensor sensing skim milk within a container and an output voltage of the sensing device.

FIG. 34 shows an example of the powder sensing device of this embodiment sensing wheat flour. As the detection coil 11 of the sensor 1 is moved up and down near a container 110 containing wheat flour, the detection voltage V (ratio) is high in a region of the wheat flour and low in the region of air. Accordingly, if a threshold value $V_{TH}$ is set, the region where the output is larger than the threshold value $V_{TH}$ can be regarded as the region in the presence of wheat flour.

FIGS. 35 to 38 show relation between the position P of the sensor 1 of the sensing device of FIG. 33 and an output voltage V of the device when refined sugar, cocoa, coffee powder and skim milk are respectively contained in a container 100 and the detection coil 11 is moved up and down along the container 110 like FIG. 34. The boundary output voltages in regions of air and powder are different and there exists a step therebetween, so that a powder level within the container can be detected by setting a threshold value $V_{TH}$ near a boundary output. The respective boundary values are different, so that unknown powder within the container can be identified about the kind by introducing a characteristic of the difference.

The sensing device of this embodiment is described as a sensor sensing powder, but the circuit device computing a ratio of an incident wave to a reflected wave is applicable to a sensor sensing other material such as liquid and so forth.

Humidity can be measured by employing hygroscopicity powder. The relation of humidity and reflected wave output is measured and the measured relation is stored in a table in advance. The sensing device of this embodiment measures a output of a reflected wave, and converts the output into humidity in view of the table to be displayed. Thus a humidity measurement device is provided.

Figure 39:
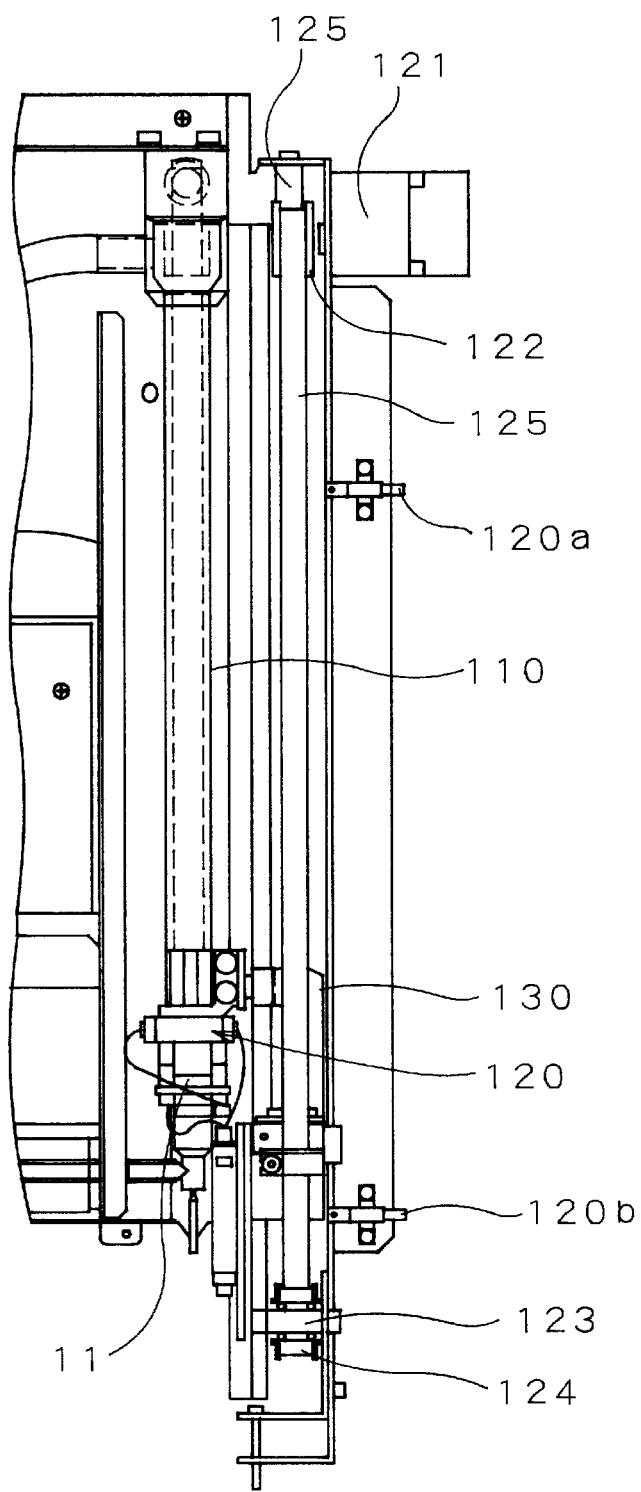
FIG. 39 is side view of a mechanism moving up and down the sensor along a tube having a small diameter.
Figure 40:
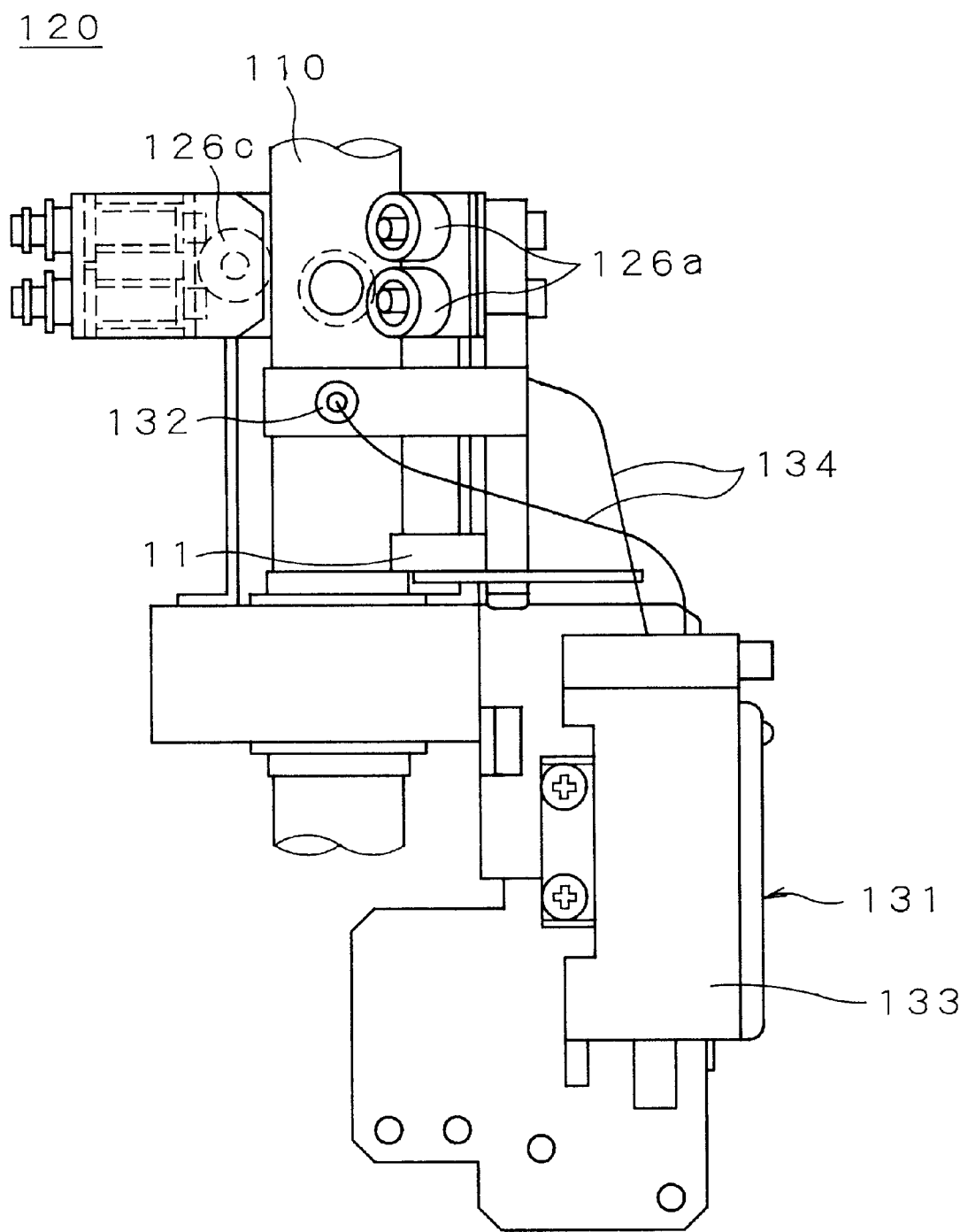
FIG. 40 is an enlarged side view of a sensor section of the mechanism viewed in a view direction.
Figure 41:
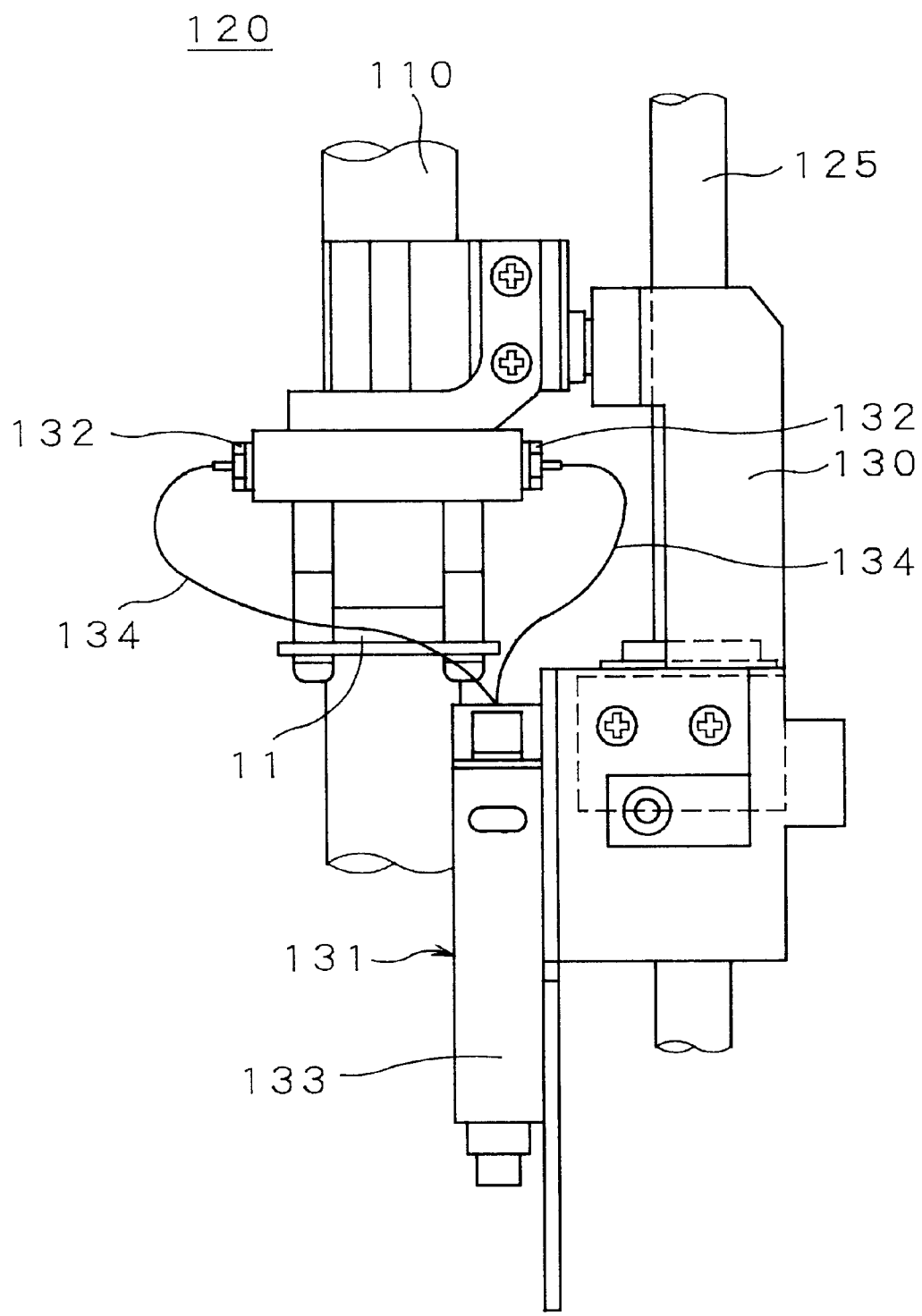
FIG. 41 is an enlarged side view of a sensor section of the mechanism viewed in other view direction.
Figure 42:
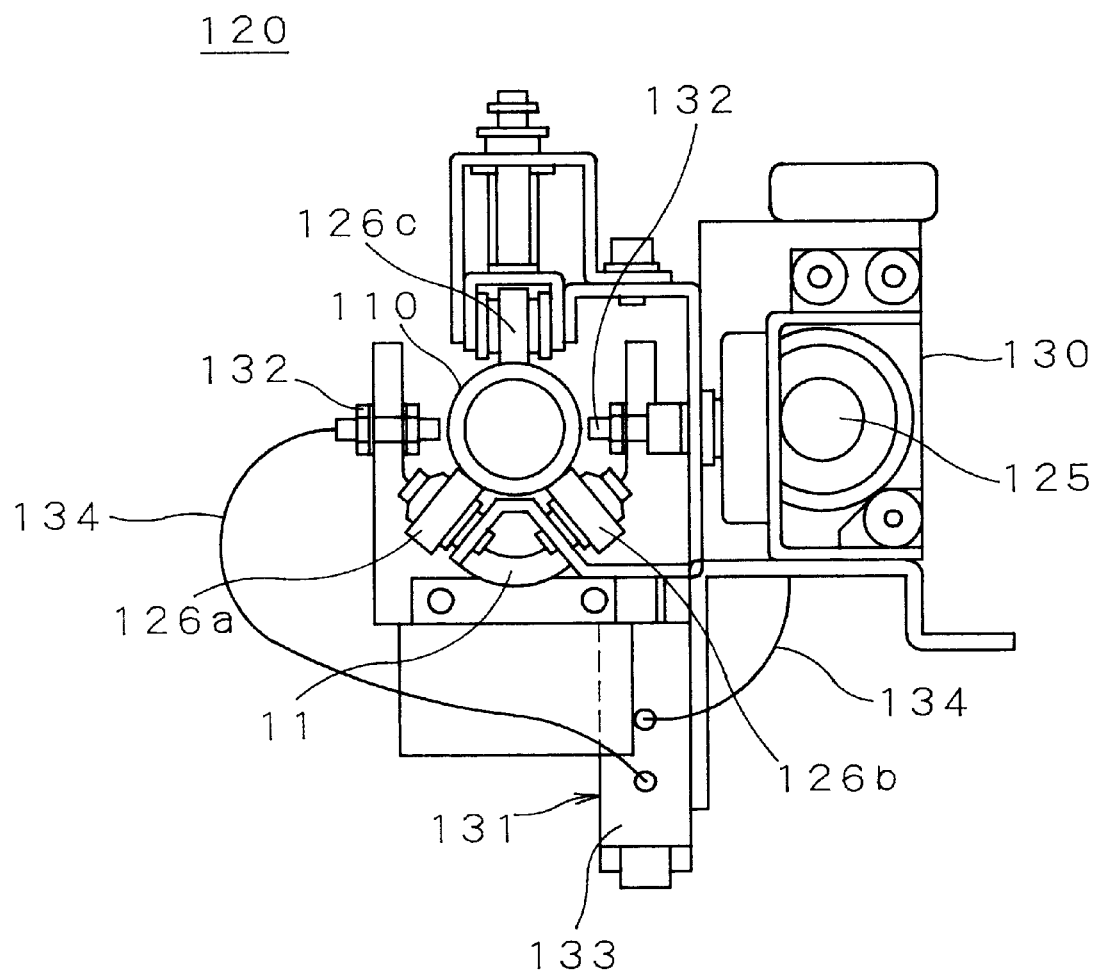
FIG. 42 is an enlarged plane view of the sensor section of the mechanism viewed from the top.

An example of a mechanism for moving up and down the detection coil 11 of FIG. 34 or the sensor 1 shown in FIGS. 6 to 14 near the container is shown in FIGS. 39 to 42. FIG. 39 shows a side view of a mechanism moving up and down a sensor 120 along a tube (container) 110 having a small diameter. FIG. 40 is an enlarged side view of the sensor 120 viewed in a view direction. FIG. 41 is an enlarged side view of the sensor 120 viewed in an other view direction, and FIG. 42 is an enlarged plane view of the sensor 120 viewed from the top.

In FIGS. 39 to 42, the sensor 120 is supported by a support member 130 for an up and down movement. The support member 130 is fixed by a belt 125 engaged between a pulley 122 mounted on a rotary shaft of a pulse motor 121 and a pulley 124 rotatably mounted on a shaft 123 by a bearing, and guided by a guide shaft 125 standing along the narrow tube 120. As a moving member for the sensor 120, a combination of a pole screw and a nut or a linear pulse motor may be employed instead of the above-mentioned belt and pulley. There are disposed at a predetermined position an upper limit detector 120a for detecting an upper limit position of the sensor and a lower limit detector 120b for detecting a lower limit position of the sensor.

The sensor 120 is constituted with the sensor 1 of the detector of FIG. 33 and a photo sensor 131. The photo sensor 131 includes a light projecting and receiving member 132 sandwitching the narrow tube 110 in a confronting relationship, and an optical fiber 134 connected with a photo sensor body 133 enclosing a light emitting element and a light receiving element. The photo sensor 131 is not directly related to this invention. The detection coil 11 of this invention is disposed at a slight lower position than the light projecting and receiving member 132 of the photo sensor 131, and the detection coil 11 is near a peripheral surface of the narrow tube 110.

The sensor 120 is located from the narrow tube 110 for a distance by rollers 126a, 126b and 126c contacting the tube 110 in three directions. A pair of rollers 126a and 126b are arranged in a vertical line. As the pulse motor 121 is turned on, the sensor 120 is moved up or down along a guide shaft 125 above or under the support member 130. The sensor 120 moves together with a support member 130, and the light projecting and receiving member 132 of the photo sensor 131 and the detection coil 11 of the sensor 1 stably move retaining a predetermined distance from and near the narrow tube 110.

According to this invention, substance, material and the human body is sensed by detecting a signal relating to change of permeability near a sensor, whereby the detection of a substance contained in a stained or opaque container which cannot be sensed by a photo sensor can be performed. Even if a container has a label adhered to it, a substance within the container can be sensed. The detection of a material of a substance which cannot be detected by a photo sensor, an electric conductive method and an ultrasonic sensor is performed based on a difference of magnetic permeability of the substance. Contactless detection is also possible. The detection of a boundary face of different material which cannot be detected by an electric conductive method, an ultrasonic, a dielectric method, and a proximity switch can be performed. Any reflector nor a pair of electrodes are not necessary. Any float also is not necessary in the detection of a liquid level. The liquid level detection is not influenced by bubbles. A substance and liquid within a closed container can be detected. The sensing device of this invention can be used as a proximity switch sensing a material other than metals. A distance between a substance and liquid also can be measured. These effects can be selectively found in the foregoing sensing devices capable detecting articles to be detected.

While the invention has been described and illustrated with respect to certain embodiments which give satisfactory results, it will be understood by those skilled in the art, after understanding the purpose of the invention, that various other changes and modifications may be made without departing from the spirit and scope of the invention, and it is, therefore, intended in the appended claims to cover all such changes and modifications.

What is claimed is:

1. A sensing device comprising
   an oscillator for generating a high frequency signal,
   a sensor including a resonance circuit receiving said high frequency signal from the oscillator, and
   a detector located between said oscillator and said sensor for detecting a reflected wave in accordance with an external state near said sensor and for producing a signal relating to said reflected wave,
   wherein said sensor and said detector consist of passive elements without employing any active elements.

2. A sensing device according to claim 1, wherein said detector detects the reflected wave in accordance with a variation of an impedance from an external state near said sensor.

3. A sensing device according to claim 1, in which
   said high frequency signal being designed to be such a high frequency that the outputs of said detector are different in the presence and the absence of a predetermined non-magnetic material or substance near said sensor.

4. A sensing device according to claim 1, in which said frequency is between 10 MHz and 300 MHz.

5. A sensing device according to claim 1, in which
   said resonance circuit is disposed to be influenced by a magnetic permeability of a material or substance nearby, and
   said detector detects a variation of said resonance circuit influenced by the magnetic permeability of the nearby material or substance to produce a signal relating to the variation.

6. A sensing device according to claim 1, in which
said resonance circuit has such a resonance frequency that a signal frequency of said oscillator is positioned on a steep slope of a resonance characteristic.

7. A sensing device according to claim 1, in which
said resonance circuit resonates and an imaginary number of its impedance is set to be around zero when an external state near the sensor is a reference state, and
said detector produces a signal relating to an increase of the imaginary number of said impedance of the sensor.

8. A sensing device according to claim 1, including
a negative feedback circuit interposed between said sensor and said oscillator.

9. A sensing device comprising
an oscillator for generating a high frequency signal,
a sensor including a resonance circuit receiving said high frequency signal from the oscillator, and
a detector for producing a signal relating to a variation of an impedance change of said sensor, said sensor and said detector consisting of passive elements without employing any active elements,
wherein said resonance circuit includes a coil wound around a toroidal core.

10. A sensing device comprising
an oscillator for generating a high frequency signal,
a sensor including a resonance circuit receiving said high frequency signal from the oscillator and a transformer for supplying said resonance circuit with power, and
a detector for producing a signal relating to a variation of an impedance change of said sensor, said sensor and said detector consisting of passive elements without employing any active elements,
wherein said resonance circuit includes a detection coil for sensing a state near the detection coil and a capacitor connected in series or parallel with the detection coil.

11. A sensing device comprising
an oscillator for generating a high frequency signal,
a sensor including a resonance circuit receiving said high frequency signal from said oscillator in which said resonance circuit resonates and an imaginary number of its impedance is set to be around zero when a state nearby the sensor is a reference state, and
a detector for producing a signal relating to an increase of the imaginary number of said impedance of the sensor and for detecting a phase shift of said reflected wave against said high frequency signal produced by said oscillator.

12. A sensing device comprising
an oscillator for generating a high frequency signal,
a sensor including a resonance circuit receiving said high frequency signal from said oscillator in which said resonance circuit resonates and an imaginary number of its impedance is set to be around zero when a state nearby the sensor is a reference state, and
a detector for producing a signal relating to an increase of the imaginary number of said impedance of the sensor and for converting power of said reflected wave into a voltage to generate the converted voltage.

13. A sensing method comprising the steps of:
applying a high frequency signal from an oscillator to a sensor having a resonance circuit,
detecting at a point between said oscillator and said sensor a signal including a reflected wave reflected by a variation of an impedance of said sensor relating to an external state, and
detecting an external state and the presence or absence of a substance or material based on said detected signal.

14. A liquid concentration sensing device comprising:
an oscillator for generating a high frequency signal,
a sensor including a resonance circuit receiving said high frequency signal from said oscillator,
a detector located between said oscillator and said sensor for detecting a reflected wave reflected according to an external state near said sensor to produce an output signal relating to said reflected wave,
a processor for converting said output signal from said detector into a solute concentration, and
a display for displaying the solute concentration from said processor.

15. A liquid concentration sensing device comprising
an oscillator for generating a high frequency signal,
a sensor including a resonance circuit receiving said high frequency signal from said oscillator,
a detector for detecting a reflected wave reflected according to an external state near said sensor to produce an output signal relating to said reflected wave,
a processor for converting said output signal from said detector into a solute concentration,
a display for displaying the output signal from said processor, and
a temperature sensor for sensing temperature of liquid, in which said processor compensates said concentration about temperature based on an output from said temperature sensor.

16. A liquid concentration sensing method comprising the steps of:
applying a high frequency signal from an oscillator to a sensor having a resonance circuit,
detecting a reflected signal relating to a concentration of a liquid in a detector connected between said oscillator and said sensor,
converting said detected signal into a solute concentration value in a processor, and
displaying said concentration value on a display.

17. A temperature sensing device comprising:
an oscillator for generating a high frequency signal,
a sensor including a resonance circuit for receiving said high frequency signal from said oscillator,
a detector for detecting a reflected wave reflected from a temperature dependent water solution disposed near said sensor to produce an output signal relating to said reflected wave,
a processor for converting said output signal relating to said temperature of said water solution into a temperature, and
a display for displaying an output signal produced from said processor.

18. A sensing device comprising
an oscillator for generating a high frequency signal,
a sensor including a resonance circuit receiving said high frequency signal from said oscillator and having a coil so disposed to be influenced by a permeability of a material or substance near said sensor, and
a detector for detecting a variation in said resonance circuit influenced by a permeability of material or substance externally existing near said sensor to produce a signal relating to said variation,
said sensor being connected with said oscillator and said detector through a cable and separately isolated from said oscillator and said detector.

* * * * *